US009768219B2

(12) United States Patent
Hori

(10) Patent No.: US 9,768,219 B2
(45) Date of Patent: Sep. 19, 2017

(54) IMAGING DEVICE AND METHOD OF MANUFACTURING THE SAME

(71) Applicant: RENESAS ELECTRONICS CORPORATION, Koutou-ku, Tokyo (JP)

(72) Inventor: Shinya Hori, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/952,543

(22) Filed: Nov. 25, 2015

(65) Prior Publication Data

US 2016/0172405 A1 Jun. 16, 2016

(30) Foreign Application Priority Data

Dec. 12, 2014 (JP) ................................. 2014-251855

(51) Int. Cl.
*H01L 27/146* (2006.01)
*H01L 21/768* (2006.01)
*H01L 23/48* (2006.01)

(52) U.S. Cl.
CPC .. *H01L 27/14636* (2013.01); *H01L 21/76898* (2013.01); *H01L 23/481* (2013.01); *H01L 27/14603* (2013.01); *H01L 27/14621* (2013.01); *H01L 27/14623* (2013.01); *H01L 27/14627* (2013.01); *H01L 27/14632* (2013.01); *H01L 27/14643* (2013.01); *H01L 27/14685* (2013.01); *H01L 27/14687* (2013.01); *H01L 27/14689* (2013.01)

(58) Field of Classification Search
CPC ......... H01L 27/14636; H01L 27/14621; H01L 27/14623; H01L 27/14643; H01L 27/14685; H01L 27/14689; H01L 27/14627
USPC .............................................. 257/432; 438/65
See application file for complete search history.

(56) References Cited

U.S. PATENT DOCUMENTS

| 8,564,135 B2 * | 10/2013 | Pyo ...................... H01L 23/481 |
| | | 257/432 |
| 2005/0023700 A1 * | 2/2005 | Singh .................... H01L 23/528 |
| | | 257/773 |
| 2005/0098893 A1 * | 5/2005 | Tsutsue ................. H01L 23/564 |
| | | 257/758 |
| 2005/0104148 A1 | 5/2005 | Yamamoto et al. |
| 2011/0001208 A1 * | 1/2011 | Furuyashiki ............ H01L 24/48 |
| | | 257/433 |

(Continued)

FOREIGN PATENT DOCUMENTS

| JP | 2005-150463 A | 6/2005 |
| JP | 2011-014674 A | 1/2011 |

*Primary Examiner* — Yasser A Abdelaziez
(74) *Attorney, Agent, or Firm* — Shapiro, Gabor and Rosenberger, PLLC

(57) ABSTRACT

A groove-type through hole passing through a silicon layer and a first interlayer insulating film is formed in a region around a chip formation region including a photodiode. In the groove-type through hole, a wall-like wall-type conductive pass-through portion corresponding to the groove-type through hole is formed. An electrode pad is in contact with the wall-type conductive pass-through portion. The electrode pad is electrically connected to a first interconnection through the wall-type conductive pass-through portion.

6 Claims, 28 Drawing Sheets

(56) References Cited

U.S. PATENT DOCUMENTS

2013/0194464 A1* 8/2013 Suzuki ............ H01L 31/02325
　　　　　　　　　　　　　　　　　　　　　　　348/294
2013/0248862 A1* 9/2013 Inoue ................ H01L 31/0224
　　　　　　　　　　　　　　　　　　　　　　　257/48

* cited by examiner

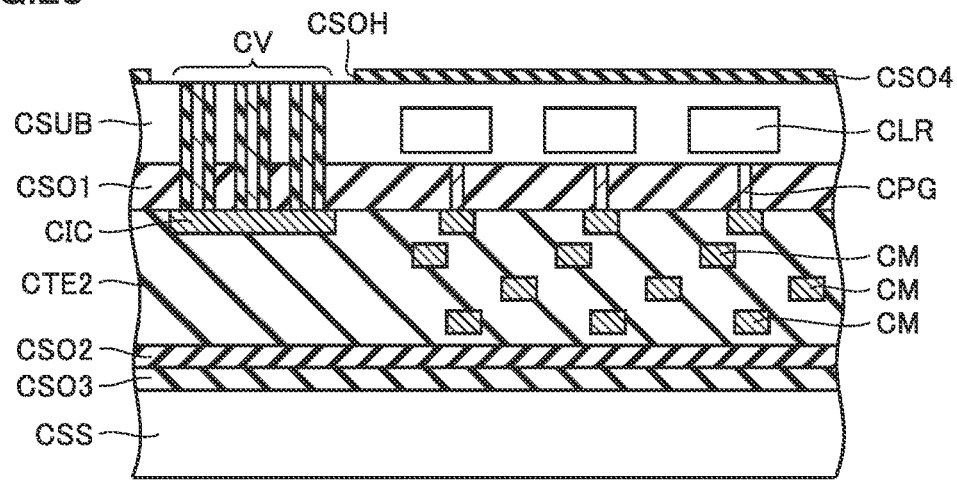
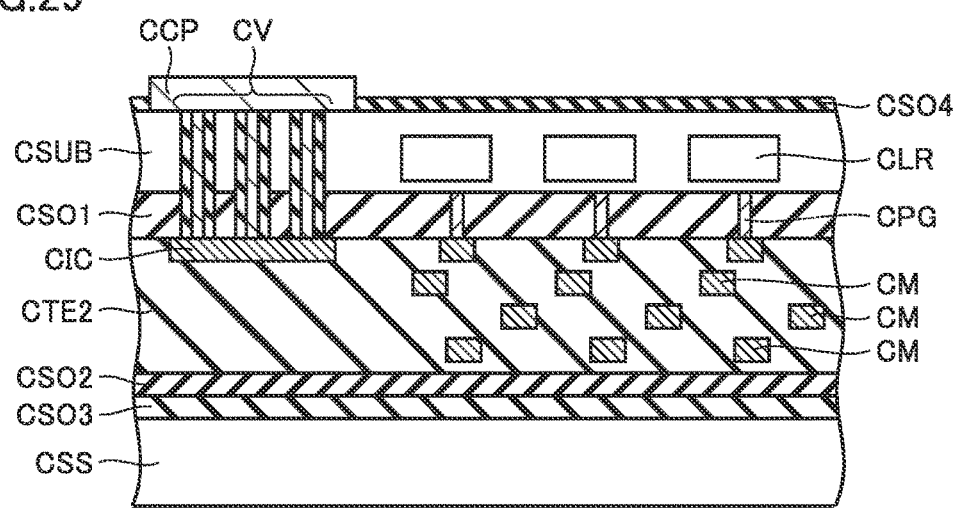

IMAGING DEVICE AND METHOD OF MANUFACTURING THE SAME

This nonprovisional application is based on Japanese Patent Application No. 2014-251855 filed with the Japan Patent Office on Dec. 12, 2014, the entire contents of which are hereby incorporated by reference.

BACKGROUND OF THE INVENTION

Field of the Invention

The present invention relates to an imaging device and a method of manufacturing the same, and for example, can suitably be made use of for an imaging device including a photodiode and an electrode pad.

Description of the Background Art

For example, an imaging device including a complementary metal oxide semiconductor (CMOS) image sensor is applied to a digital camera. In the imaging device, a photodiode is formed for converting incident light into charges. Charges generated in the photodiode are transferred to a floating diffusion region by a transfer transistor. The transferred charges are converted to an electric signal by an amplification transistor and output as an image signal.

A method of receiving incident light on a front surface of a semiconductor substrate has conventionally been known as a method of receiving incident light on a photodiode. A CMOS image sensor of this type is called a front side illuminated CMOS image sensor. In the front side illuminated CMOS image sensor, however, with reduction in size of the imaging device, incident light is cut off by multilayered interconnections formed on the photodiode and light incident on the photodiode has disadvantageously been weakened.

In order to solve this problem, for example, Patent Literature 1 (Japanese Patent Laying-Open No. 2011-14674) and Patent Literature 2 (Japanese Patent Laying-Open No. 2005-150463) have proposed a back side illuminated CMOS image sensor in which light is incident on a back surface of a semiconductor substrate opposite to a front surface on a side where interconnections are formed. Namely, a technique to receive incident light on a back surface of a semiconductor substrate decreased in thickness through polishing and to guide light to a photodiode formed on a front surface side of the semiconductor substrate has been proposed.

In such an imaging device having a back side illuminated CMOS sensor, since incident light is received on the back surface of the semiconductor substrate, an electrode pad for external electric connection is formed on the back surface of the semiconductor substrate and a metal wire is wire-bonded to the electrode pad. The electrode pad formed on the back surface of the semiconductor substrate and the interconnection formed on the front surface side of the semiconductor substrate are electrically connected to each other by a conductor passing through the semiconductor substrate. The conventional back side illuminated imaging device is constructed as above.

SUMMARY OF THE INVENTION

In an imaging device including a back side illuminated CMOS sensor, a probe should be brought in contact with an electrode pad in conducting an electrical test such as a wafer test. In addition, since a metal wire is finally wire-bonded to the electrode pad, a structure including a conductor passing through the semiconductor substrate which is located in a region where the electrode pad is arranged is required to have mechanical strength.

In the conventional imaging device, however, a through via made of a metal material and formed in a contact hole having a prescribed opening diameter is formed as a conductor which passes through a semiconductor substrate, and hence higher mechanical strength is required.

Other problems and novel features will become apparent from the description herein and the accompanying drawings.

An imaging device according to one embodiment includes a light reception sensor portion, a support substrate, a plurality of interconnection layers, a light incident region, an electrode pad, and a conductive pass-through portion. The light reception sensor portion is formed on a side of a first main surface of a semiconductor layer having opposing first main surface and second main surface. The support substrate is formed on a side of the first main surface of the semiconductor layer with an interlayer insulating layer being interposed. A plurality of interconnection layers are formed between the interlayer insulating layers. The light incident region is formed on a side of the second main surface of the semiconductor layer. The electrode pad is formed on the side of the second main surface of the semiconductor layer. The conductive pass-through portion includes a wall-like wall-type conductive pass-through portion which is formed to pass through the semiconductor layer as being in contact with the electrode pad and electrically connects the electrode pad and one interconnection layer of the plurality of interconnection layers to each other.

A method of manufacturing an imaging device according to another embodiment includes the steps below. A light reception sensor portion is formed in a first main surface of a semiconductor layer supported by a first support substrate. A through hole including a groove-like groove-type through hole passing through the semiconductor layer, which reaches a second main surface opposed to the first main surface from a side of the first main surface of the semiconductor layer is formed. A conductive pass-through portion including a wall-like wall-type conductive pass-through portion corresponding to the groove-type through hole is formed by forming a conductive film in a through hole as electrically being isolated from the semiconductor layer. A plurality of interconnection layers including an interconnection layer electrically connected to the conductive pass-through portion and an interlayer insulating film are formed on the side of the first main surface of the semiconductor layer. A second support substrate is bonded to the interlayer insulating film. The first support substrate is removed. An electrode pad electrically connected to the conductive pass-through portion as being in contact with the conductive pass-through portion is formed on a side of the second main surface of the semiconductor layer.

According to the imaging device in one embodiment, mechanical strength of a region where an electrode pad is arranged can be improved.

According to the method of manufacturing an imaging device in another embodiment, an imaging device having improved mechanical strength of a region where an electrode pad is arranged can be manufactured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 28 is a cross-sectional view showing a step performed after the step shown in FIG. 27.

FIG. 29 is a cross-sectional view showing a step performed after the step shown in FIG. 28.

DESCRIPTION OF THE PREFERRED EMBODIMENTS

First Embodiment

An imaging device in which an electrode pad and an interconnection are electrically connected to each other by a wall-type conductive pass-through portion will be described here.

Figure 1:
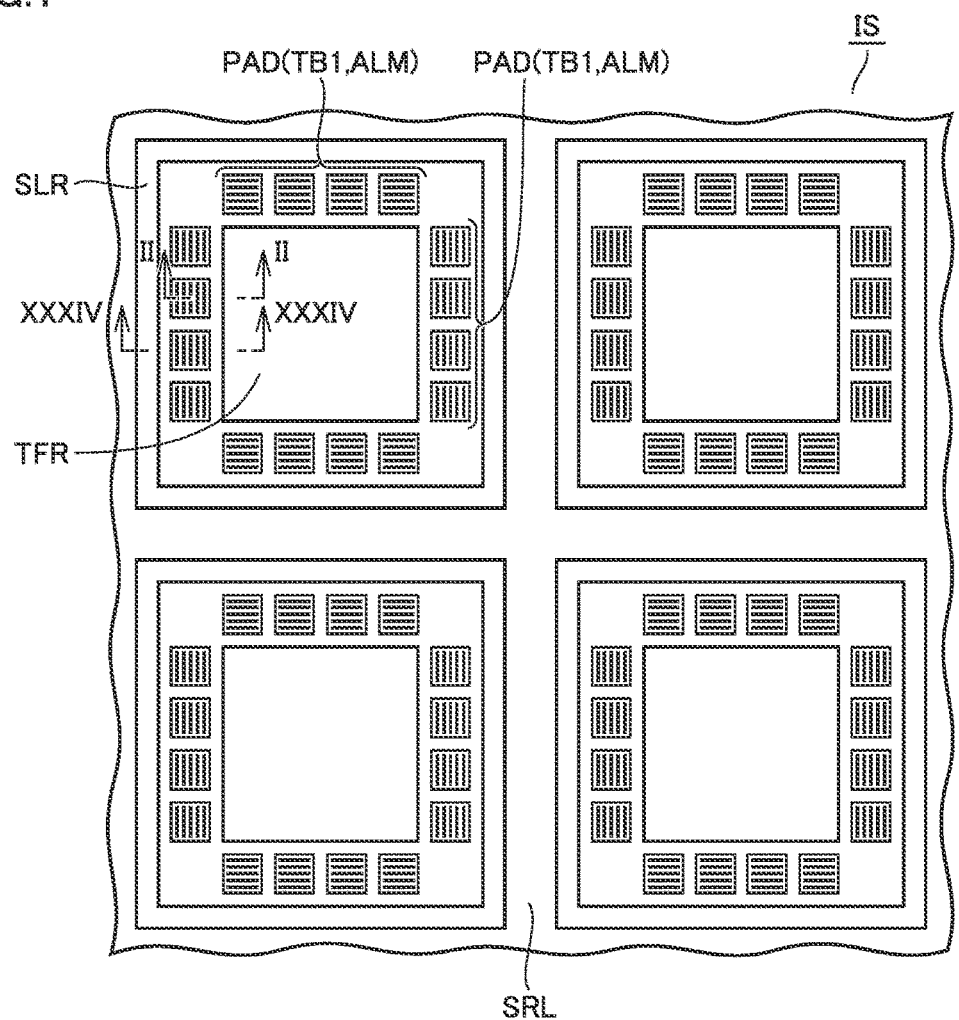
FIG. 1 is a partial plan view showing a state before dicing of an imaging device according to a first embodiment.

As shown in FIG. 1, in an imaging device IS, an electrode pad PAD electrically connecting a light reception sensor portion and the outside to each other is arranged around a chip formation region TFR in which the light reception sensor portion including a photodiode is formed. As will be described later, electrode pad PAD is electrically connected to a prescribed interconnection (not shown) by a wall-type conductive pass-through portion TB1 formed in a groove-type through hole passing through a silicon layer. Electrode pad PAD has a function as an alignment mark.

A seal ring SLR is arranged to surround electrode pads PAD. In a state of a wafer before dicing, a scribe line SRL is located between seal ring SLR and seal ring SLR which are adjacent to each other.

Figure 2:
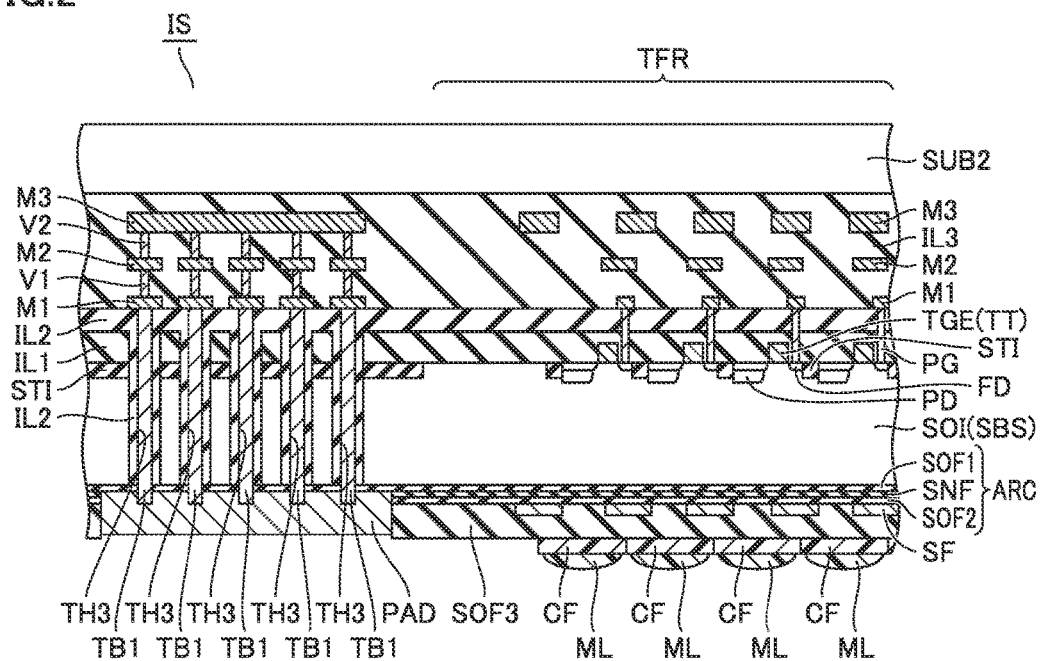
FIG. 2 is a cross-sectional view along the line II-II shown in FIG. 1 in the first embodiment.

A structure of electrode pad PAD and chip formation region TFR (photodiode) will now be described in detail. As shown in FIG. 2, chip formation region TFR is defined by an isolation region ST1 on one main surface of a silicon layer SOI. In chip formation region TFR, the light reception sensor portion including a photodiode PD, a floating diffusion region FD, and a transfer transistor TT having a gate electrode TGE is formed.

A support substrate SUB2 is formed to cover gate electrode TGE, with a first interlayer insulating film ILL a second interlayer insulating film IL2, and an interlayer insulating film IL3 being interposed. Interlayer insulating film IL3 is formed from a plurality of layers, and a first interconnection M1, a second interconnection M2, and a third interconnection M3 are formed between the layers. In chip formation region TFR, a conductive plug PG electrically connecting first interconnection M1 and floating diffusion region FD to each other is formed.

In a region opposed to photodiode PD on a side of the other main surface of silicon layer SOL an antireflection coating ARC, a light shield film SF, a color filter CF, and a microlens ML are formed. Antireflection coating ARC is formed from a silicon oxide film SOFT, a silicon nitride film SNF, and a silicon oxide film SOF2. Light shield film SF is formed, for example, from an aluminum film. A silicon oxide film SOF3 is interposed between antireflection coating ARC and color filter CF. In chip formation region TFR, a circuit portion (not shown) which processes charges generated in photodiode PD as an image signal is formed.

In a region around chip formation region TFR, a groove-type through hole TH3 passing through silicon layer SOI and first interlayer insulating film IL1 is formed, and wall-type conductive pass-through portion TB1 is formed in groove-type through hole TH3 with second interlayer insulating film IL2 being interposed. Second interlayer insulating film IL2 electrically isolates wall-type conductive pass-through portion TB1 from silicon layer SOI.

Wall-type conductive pass-through portion TB1 is formed to protrude from a surface of silicon layer SOI into electrode pad PAD. As wall-type conductive pass-through portion TB1 protrudes from the surface of silicon layer SOI, a function as an alignment mark ALM (see FIG. 3) can be enhanced.

Figure 3:
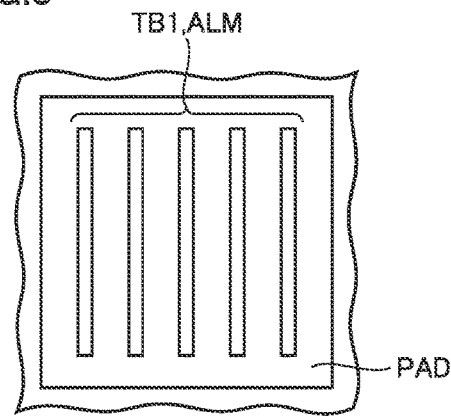
FIG. 3 is a partial enlarged plan view showing a region where an electrode pad is arranged in the first embodiment.

Here, wall-type conductive pass-through portion TB1 means a wall-like conductive pass-through portion corresponding to a groove in shape, which is formed by embedding groove-type through hole TH3 extending in one direction with a prescribed width with a prescribed conductive film. As shown in FIGS. 1 and 3, in this imaging device IS, a plurality of wall-type conductive pass-through portions TB1 are formed, and the plurality of wall-type conductive pass-through portions TB1 extend in one direction and are arranged at a distance from one another in another direction intersecting one direction.

Electrode pad PAD arranged around chip formation region TFR is electrically connected to prescribed first interconnection M1 by wall-type conductive pass-through portion TB1. Prescribed first interconnection M1 is electrically connected to second interconnection M2 through a first via V1, and second interconnection M2 is electrically connected to third interconnection M3 through a second via V2. Imaging device IS including a back side illuminated CMOS sensor according to the first embodiment is constructed as above.

One example of a method of manufacturing imaging device IS including the back side illuminated CMOS sensor described above will now be described.

Figure 4:
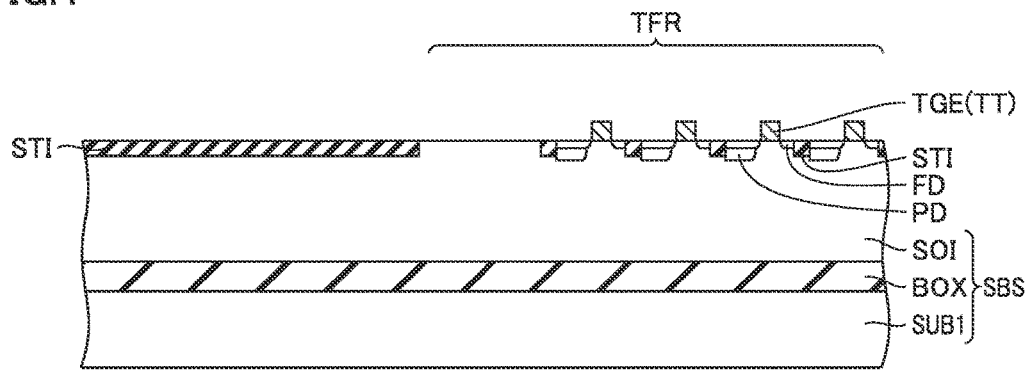
FIG. 4 is a cross-sectional view showing one step in a method of manufacturing an imaging device in the first embodiment.

Initially, an SOI substrate SBS is prepared. In SOI substrate SBS, silicon layer SOI is formed on a support substrate SUB1 with an embedded oxide film BOX being interposed (see FIG. 4). Then, as shown in FIG. 4, chip formation region TFR is defined by forming isolation region ST1 in the surface of silicon layer SOI. A region where an electrode pad is formed is defined around chip formation region TFR.

Figure 5:
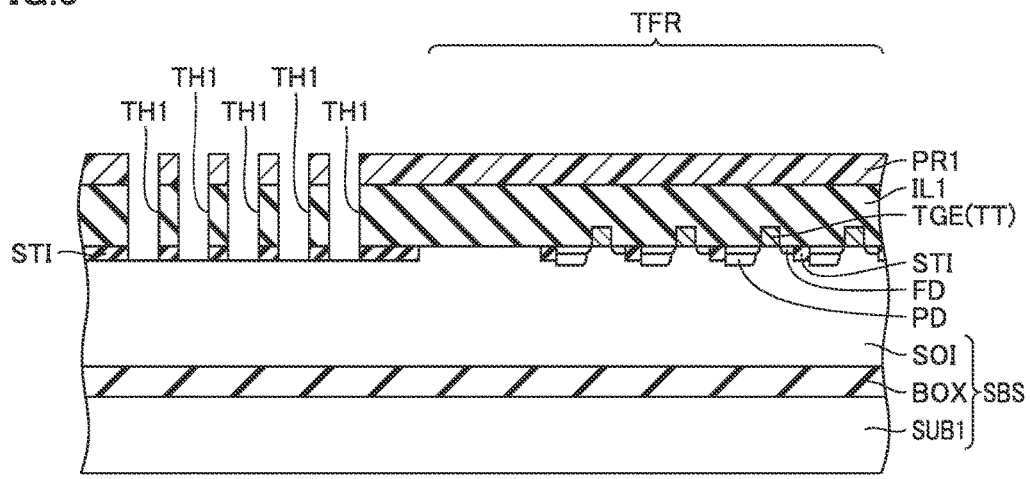
FIG. 5 is a cross-sectional view showing a step performed after the step shown in FIG. 4 in the first embodiment.

Then, gate electrode TGE of transfer transistor TT, photodiode PD, and floating diffusion region FD are formed in chip formation region TFR through general film formation, processing, and ion implantation. Then, as shown in FIG. 5, first interlayer insulating film IL1 formed from a silicon oxide film or the like is formed, for example, with chemical vapor deposition (CVD) to cover gate electrode TGE.

Then, a photoresist pattern PR1 is formed through prescribed photolithography. Then, by etching first interlayer insulating film IL1 with photoresist pattern PR1 serving as an etching mask, groove-type through hole TH1 passing through first interlayer insulating film IL1 and exposing silicon layer SOI is formed. Thereafter, photoresist pattern PR1 is removed.

Figure 6:
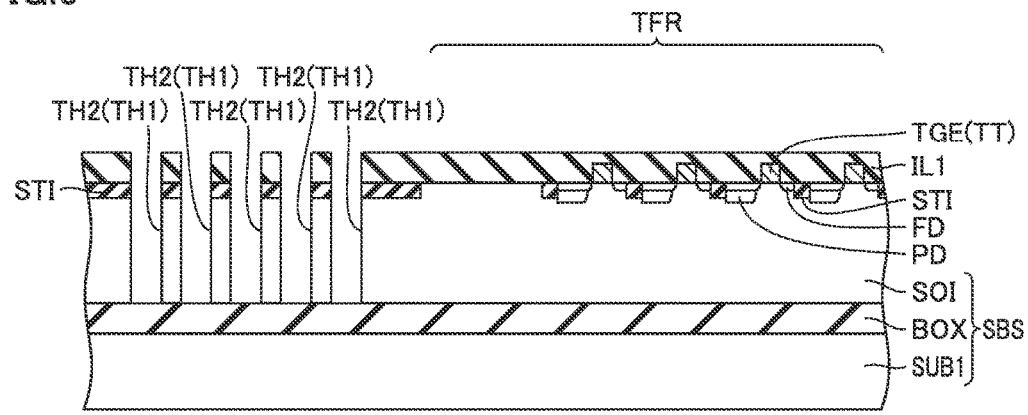
FIG. 6 is a cross-sectional view showing a step performed after the step shown in FIG. 5 in the first embodiment.

Then, as shown in FIG. 6, by etching silicon layer SOI with exposed first interlayer insulating film IL1 serving as an etching mask, a groove-type through hole TH2 passing through silicon layer SOI and exposing embedded oxide film BOX is formed.

Figure 7:
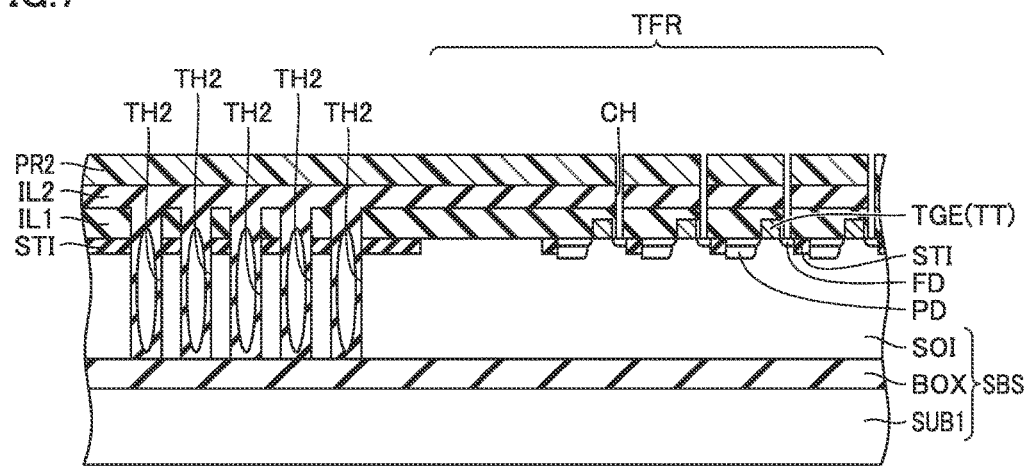
FIG. 7 is a cross-sectional view showing a step performed after the step shown in FIG. 6 in the first embodiment.

Then, as shown in FIG. 7, second interlayer insulating film IL2 formed from a silicon oxide film or the like is formed, for example, through CVD. Here, groove-type through hole TH2 is embedded with second interlayer insulating film IL2. Though FIG. 7 shows a state that a void is formed in groove-type through hole TH2, it does not show that a void is intentionally formed. Then, a surface of second interlayer insulating film IL2 is planarized by subjecting second interlayer insulating film IL2 to a chemical mechanical polishing (CMP) process (a CMP process A).

Then, a photoresist pattern PR2 is formed through prescribed photolithography. Then, by etching second interlayer insulating film IL2 and the first interlayer insulating film with photoresist pattern PR2 serving as an etching mask, a contact hole CH exposing floating diffusion region FD is formed. Thereafter, photoresist pattern PR2 is removed.

Figure 8:
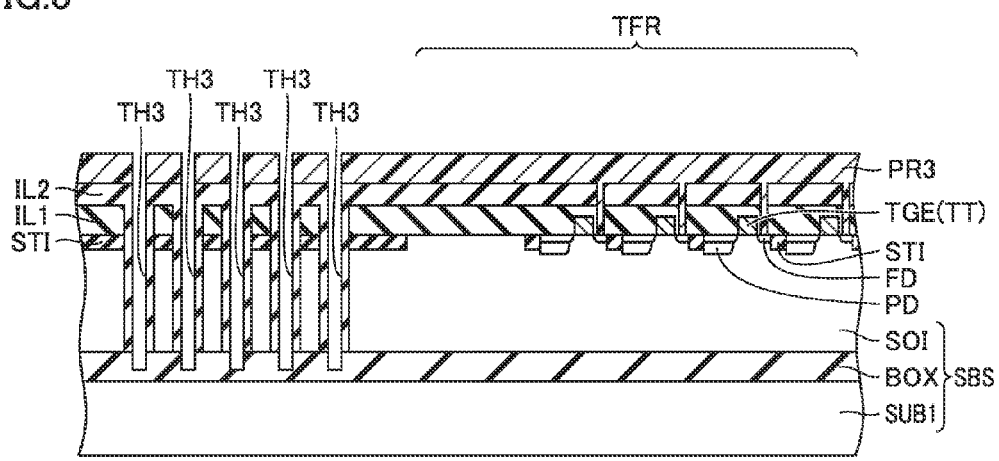
FIG. 8 is a cross-sectional view showing a step performed after the step shown in FIG. 7 in the first embodiment.

Then, as shown in FIG. 8, a photoresist pattern PR3 is formed through prescribed photolithography. Then, a groove-type through hole TH3 is formed by etching second interlayer insulating film IL2 with photoresist pattern PR3 serving as an etching mask. Here, embedded oxide film BOX is removed, for example, by approximately several ten nm by overetching.

In order not to expose silicon layer SOI on a sidewall of groove-type through hole TH3, a size and an etching condition of groove-type through hole TH3 are set in advance such that first interlayer insulating film IL1 (and second interlayer insulating film IL2) is left by approximately several ten nm between groove-type through hole TH3 and silicon layer SOI. A size of groove-type through hole TH3 with respect to a size of electrode pad PAD (approximately 100 μm×100 μm) is, for example, approximately 10 μm in width and approximately several ten μm (approximately 50 to 70 μm) in length. Thereafter, photoresist pattern PR3 is removed.

Figure 9:
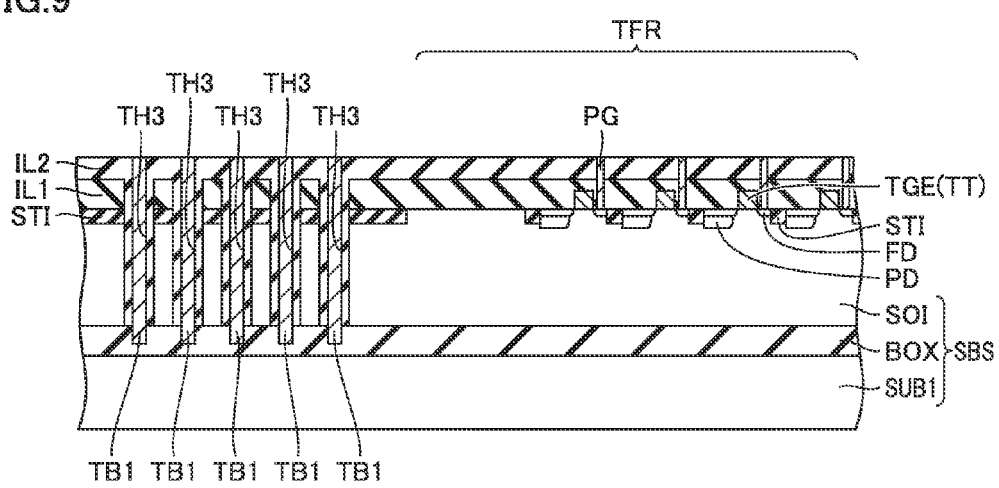
FIG. 9 is a cross-sectional view showing a step performed after the step shown in FIG. 8 in the first embodiment.

Then, for example, a conductive film (not shown) formed from a tungsten film is formed to bury groove-type through hole TH3 and contact hole CH. Then, through a CMP process (a CMP process B), a portion of the conductive film located in groove-type through hole TH3 and contact hole CH is left whereas a portion of the conductive film located on an upper surface of second interlayer insulating film IL2 is removed. Thus, as shown in FIG. 9, wall-like wall-type conductive pass-through portion TB1 corresponding to a shape of the groove is formed in groove-type through hole TH3. Conductive plug PG is formed in contact hole CH.

Then, by repeating general film formation and processing, a multi-layered interconnection structure including first interconnection M1, first via V1, second interconnection M2, second via V2, and third interconnection M3 is formed. Aluminum or copper is employed as a material for first interconnection M1, second interconnection M2, and third interconnection M3. Tungsten, titanium, titanium nitride, or copper is employed for a material for first via V1 and second via V2. When copper is employed as a material, an interconnection or a via is formed through a damascene process.

Figure 10:
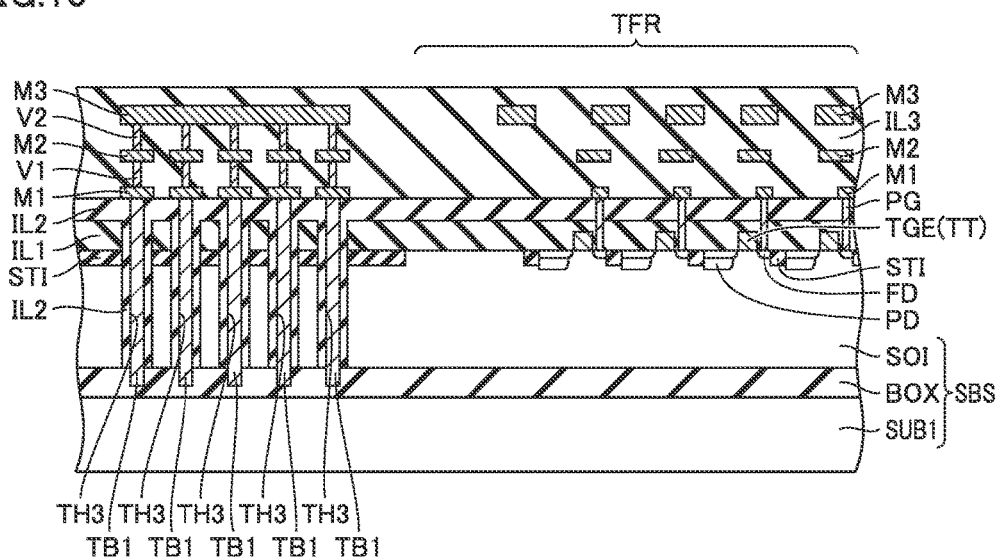
FIG. 10 is a cross-sectional view showing a step performed after the step shown in FIG. 9 in the first embodiment.

Though interlayer insulating film IL3 electrically isolating first interconnection M1, second interconnection M2, and third interconnection M3 is formed from a plurality of layers, FIG. 10 shows interlayer insulating film IL3 as an interlayer insulating film formed from a single layer for the sake of brevity of the drawing. A surface of interlayer insulating film IL3 is planarized through the CMP process.

Figure 11:
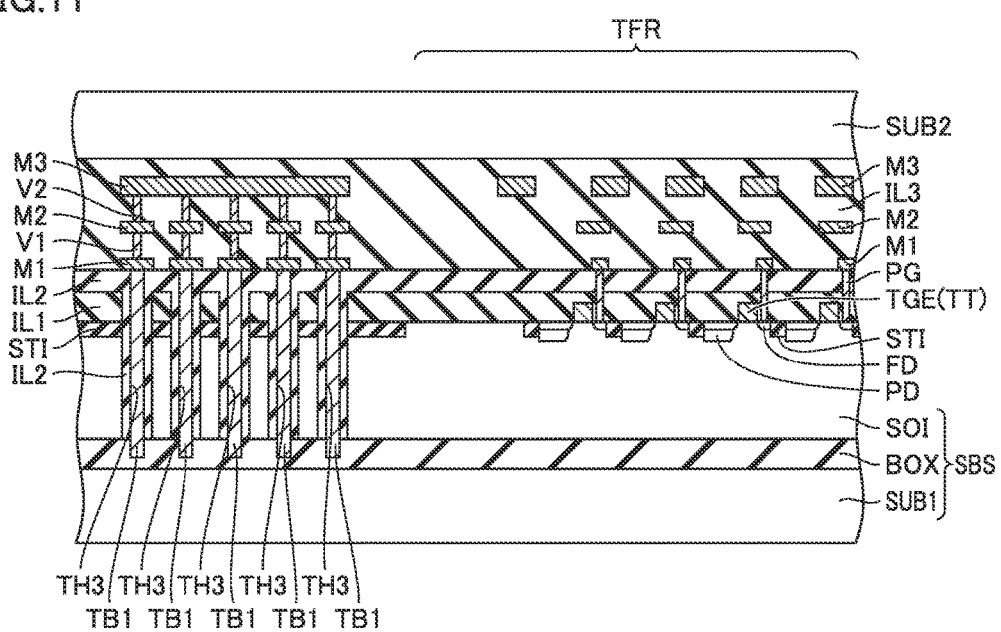
FIG. 11 is a cross-sectional view showing a step performed after the step shown in FIG. 10 in the first embodiment.
Figure 12:
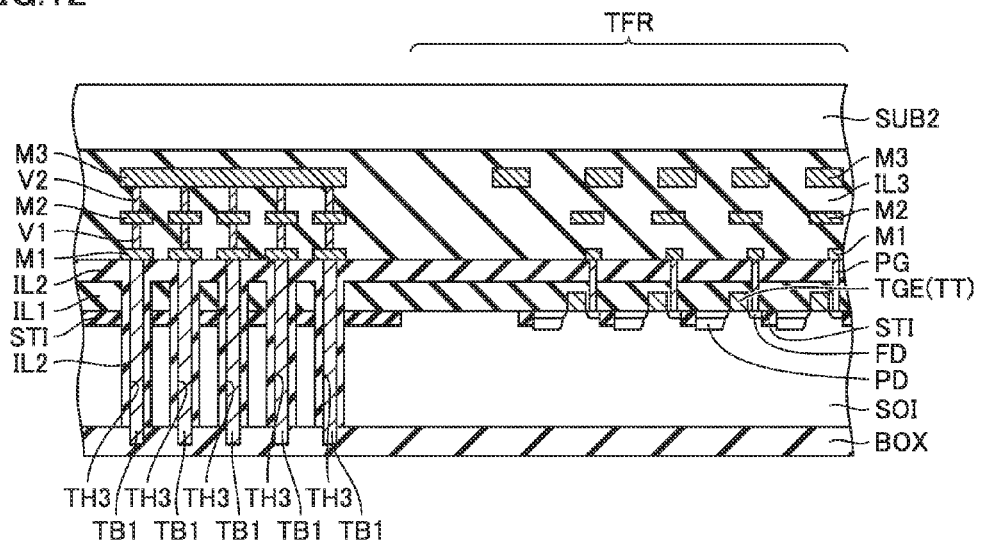
FIG. 12 is a cross-sectional view showing a step performed after the step shown in FIG. 11 in the first embodiment.

Then, a new support substrate is prepared and an oxide film is formed on a surface of the support substrate. Then, as shown in FIG. 11, that support substrate SUB2 is bonded to the surface of interlayer insulating film IL3. FIG. 11 does not show an oxide film on support substrate SUB2. Then, support substrate SUB1 is removed as shown in FIG. 12, through the CMP process, a dry etching process, or a wet etching process.

Figure 13:
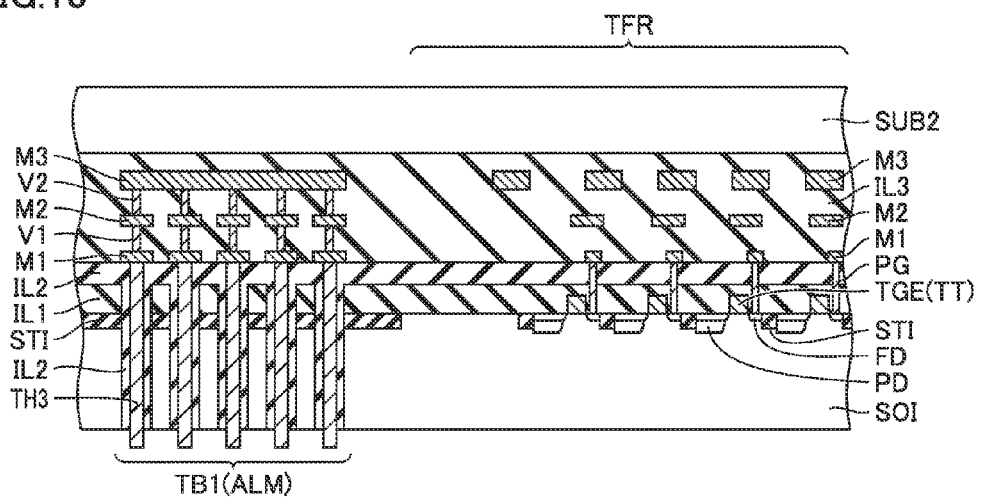
FIG. 13 is a cross-sectional view showing a step performed after the step shown in FIG. 12 in the first embodiment.
Figure 14:
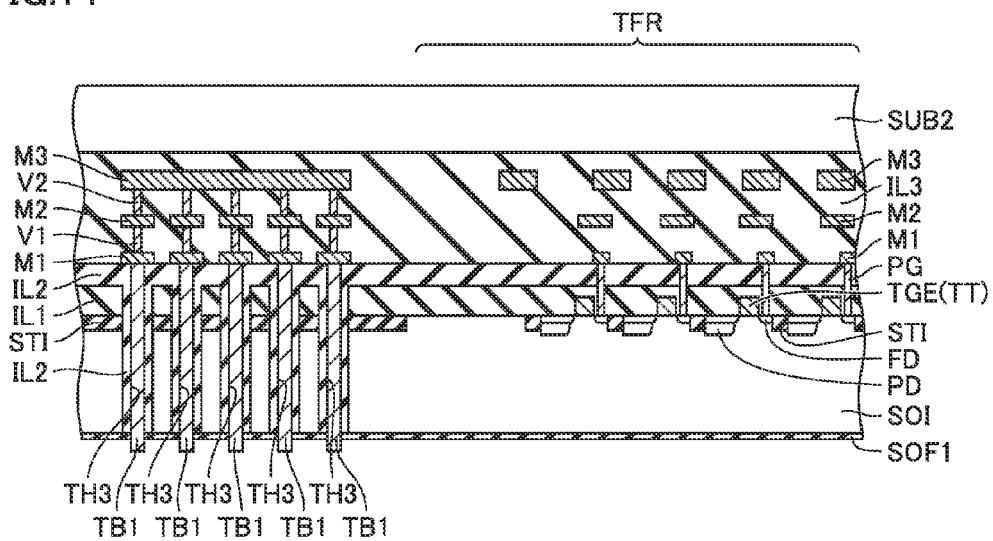
FIG. 14 is a cross-sectional view showing a step performed after the step shown in FIG. 13 in the first embodiment.
Figure 15:
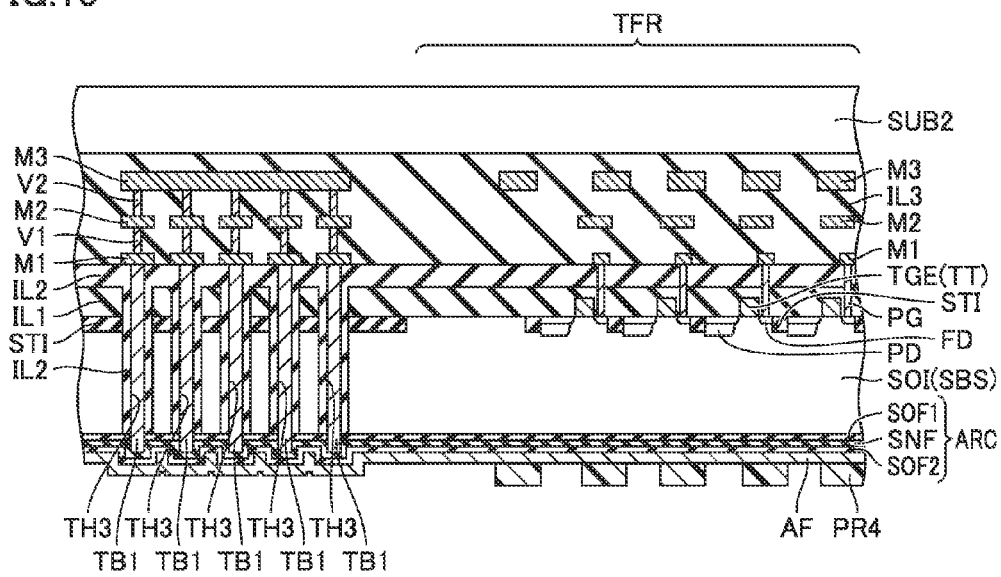
FIG. 15 is a cross-sectional view showing a step performed after the step shown in FIG. 14 in the first embodiment.

Then, as shown in FIG. 13, embedded oxide film BOX is removed through the dry etching process or the wet etching process. Thus, a portion of wall-type conductive pass-through portion TB1 protruding from the surface (back surface) of silicon layer SOI is exposed. Then, as shown in FIG. 14, silicon oxide film SOF1 is formed, for example, through CVD to cover the surface of silicon layer SOL Then, as shown in FIG. 15, silicon nitride film SNF and silicon oxide film SOF2 are successively formed, for example, through CVD to cover silicon oxide film SOF1. Silicon oxide film SOF1, silicon nitride film SNF, and silicon oxide film SOF2 are formed as antireflection coating ARC. Then, an aluminum film AF serving as a light shield film is formed to cover silicon oxide film SOF2.

Then, a photoresist pattern PR4 is formed through prescribed photolithography with protruding wall-type conductive pass-through portion TB1 serving as an alignment mark. Then, light shield film SF (see FIG. 16) is formed by etching aluminum film AF with photoresist pattern PR4 serving as an etching mask. Thereafter, photoresist pattern PR4 is removed. Then, silicon oxide film SOF3 (see FIG. 16) is formed, for example, through CVD to cover light shield film SF.

Figure 16:
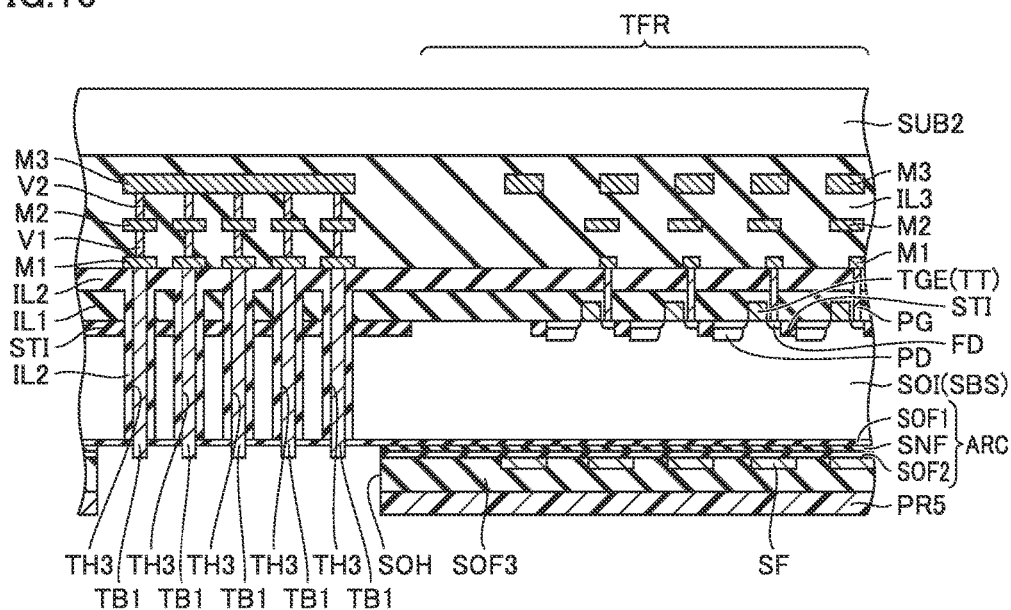
FIG. 16 is a cross-sectional view showing a step performed after the step shown in FIG. 15 in the first embodiment.

Then, a photoresist pattern PR5 (see FIG. 16) is formed through prescribed photolithography, with protruding wall-type conductive pass-through portion TB1 serving as an alignment mark. Then, as shown in FIG. 16, an opening portion SOH exposing wall-type conductive pass-through portion TB1 is formed by etching silicon oxide film SOF3 and antireflection coating ARC with photoresist pattern PR5 serving as an etching mask. Thereafter, photoresist pattern PR5 is removed.

Then, a conductive film (not shown) to form an electrode pad is formed to bury opening portion SOH. Then, a photoresist pattern (not shown) covering a portion of the conductive film located in opening portion SOH and exposing a portion of the conductive film located in another region is formed with protruding wall-type conductive pass-through portion TB1 serving as an alignment mark.

Figure 17:
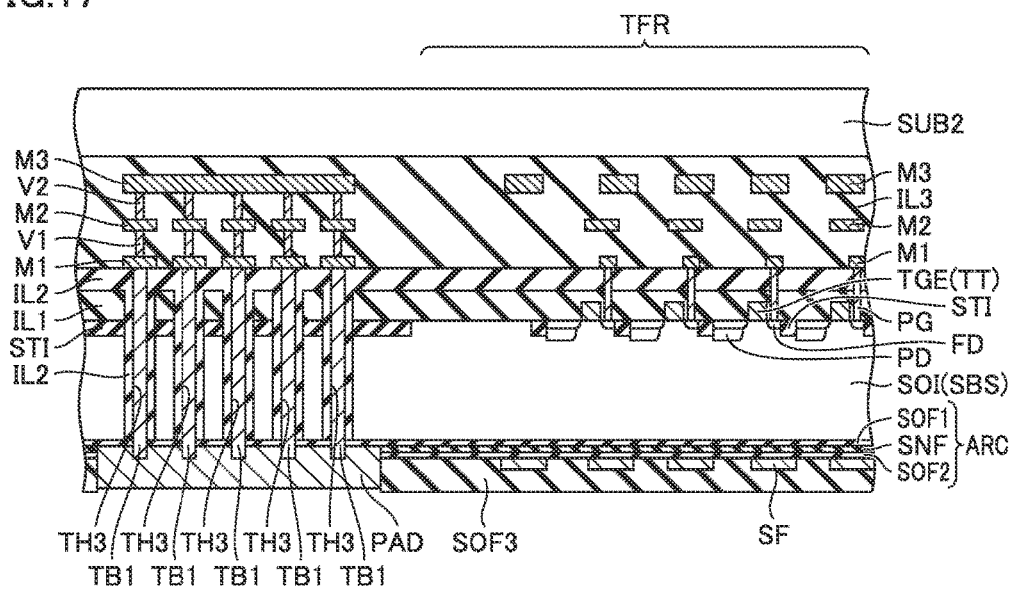
FIG. 17 is a cross-sectional view showing a step performed after the step shown in FIG. 16 in the first embodiment.

Then, the portion of the conductive film located in opening portion SOH is left whereas the portion of the conductive film located in another region is removed by dry-etching the conductive film with the photoresist pattern serving as an etching mask. Thereafter, the photoresist pattern is removed. Thus, as shown in FIG. 17, electrode pad PAD is formed in opening portion SOH. Electrode pad PAD is in contact with wall-type conductive pass-through portion TB1 and electrically connected to first interconnection M1 through wall-type conductive pass-through portion TB1.

Then, a prescribed resin film (not shown) to be a color filter is formed. Then, a photoresist pattern (not shown) is formed through prescribed photolithography with protruding wall-type conductive pass-through portion TB1 serving as an alignment mark. Then, color filter CF (see FIG. 18) is formed by etching the resin film with the photoresist pattern serving as an etching mask. Thereafter, the photoresist pattern is removed.

Figure 18:
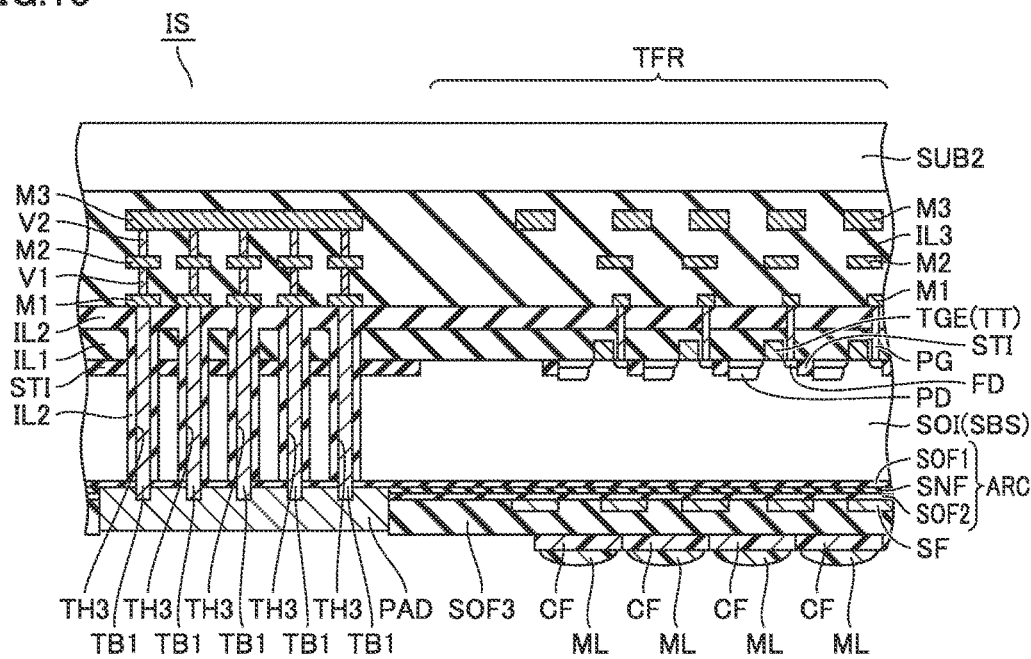
FIG. 18 is a cross-sectional view showing a step performed after the step shown in FIG. 17 in the first embodiment.

Then, a prescribed resin film (not shown) to be a microlens is formed. A photoresist pattern (not shown) is formed through prescribed photolithography with protruding wall-type conductive pass-through portion TB1 serving as an alignment mark. Then, microlens ML (see FIG. 18) is formed by etching the resin film with the photoresist pattern serving as an etching mask. Thereafter, the photoresist pattern is removed. Thus, as shown in FIG. 18, a main portion of the imaging device including the back side illuminated CMOS sensor is completed.

In imaging device IS described above, electrode pad PAD is electrically connected to first interconnection M1 through wall-type conductive pass-through portion TB1. Thus, mechanical strength of a region where electrode pad PAD is arranged can be improved, which will be described in comparison with an imaging device according to a comparative example.

Figure 19:
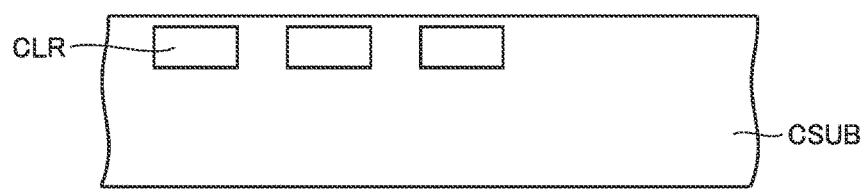
FIG. 19 is a cross-sectional view showing one step in a method of manufacturing an imaging device according to a comparative example.
Figure 20:
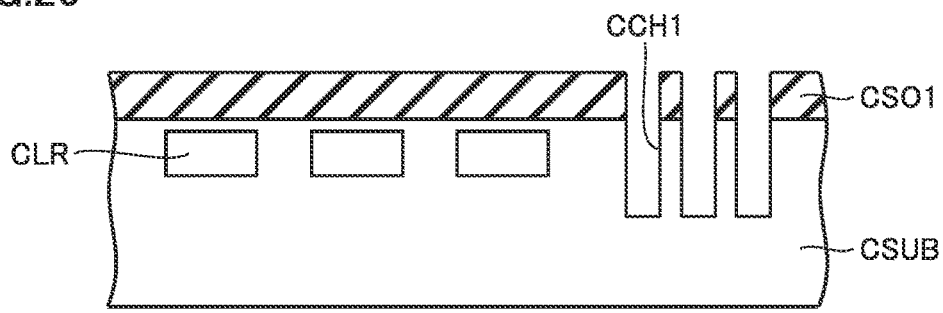
FIG. 20 is a cross-sectional view showing a step performed after the step shown in FIG. 19.

A method of manufacturing an imaging device according to the comparative example will initially be described. As shown in FIG. 19, a silicon substrate CSUB is prepared and a light reception portion CLR such as a photodiode is formed by implanting ions into one surface of silicon substrate CSUB. Then, as shown in FIG. 20, a silicon oxide film CSO1 is formed to cover one surface of silicon substrate CSUB.

Figure 21:
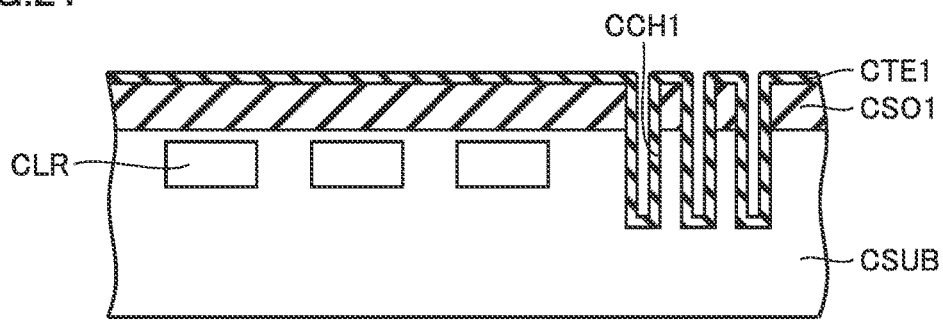
FIG. 21 is a cross-sectional view showing a step performed after the step shown in FIG. 20.

Then, a contact hole CCH1 is formed through prescribed photolithography and etching. Then, as shown in FIG. 21, a tetra ethyl ortho silicate (TEOS) film CTE1 is formed to cover a surface of silicon oxide film CSO1, which includes an inner wall surface of contact hole CCH1. Then, a portion of TEOS film CTE1 located in contact hole CCH1 is left whereas a portion of TEOS film CTE1 located on an upper surface of silicon oxide film CSO1 is removed through a CMP process (a CMP process CA).

Figure 22:
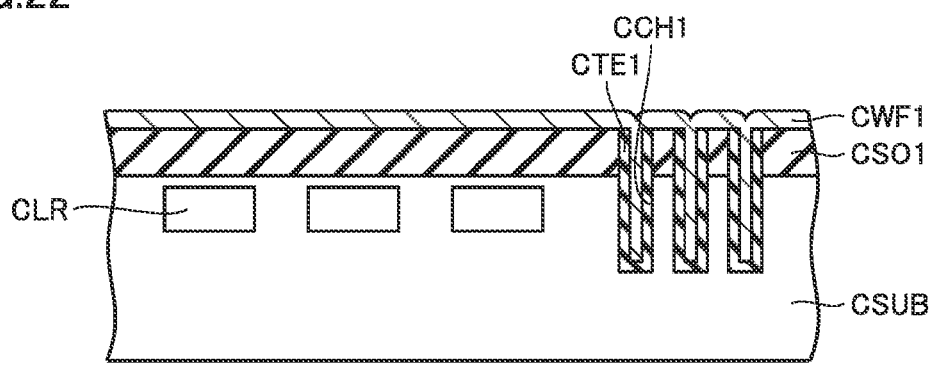
FIG. 22 is a cross-sectional view showing a step performed after the step shown in FIG. 21.
Figure 23:
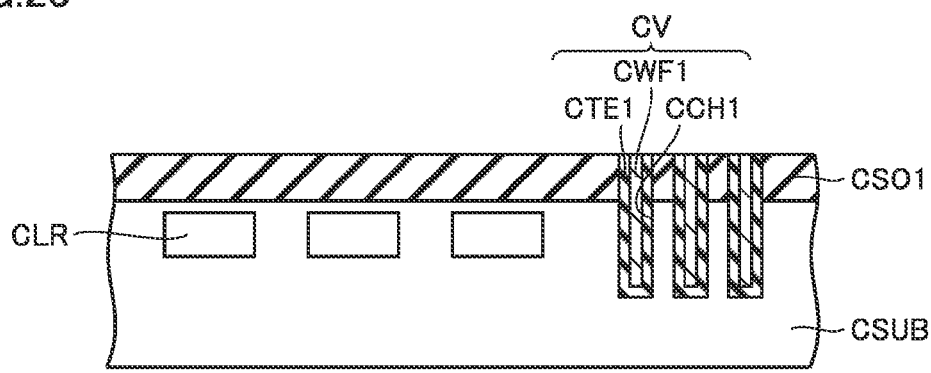
FIG. 23 is a cross-sectional view showing a step performed after the step shown in FIG. 22.

Then, as shown in FIG. 22, a tungsten film CWF1 is formed to bury the contact hole and cover the surface of silicon oxide film CSO1. Then, a portion of tungsten film CWF1 located in contact hole CCH1 is left whereas a portion of tungsten film CWF1 located on the upper surface of silicon oxide film CSO1 is removed through a CMP process (a CMP process CB). Thus, a through via CV is formed as shown in FIG. 23.

Figure 24:
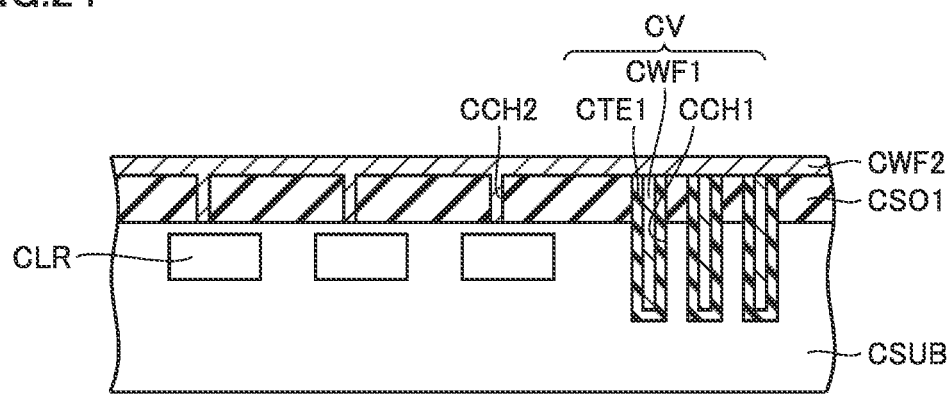
FIG. 24 is a cross-sectional view showing a step performed after the step shown in FIG. 23.

Then, as shown in FIG. 24, a contact hole CCH2 is formed in a region where light reception portion CLR is formed through prescribed photolithography and etching. Then, a tungsten film CWF2 is formed to bury contact hole CCH2 and cover the surface of silicon oxide film CSO1.

Figure 25:
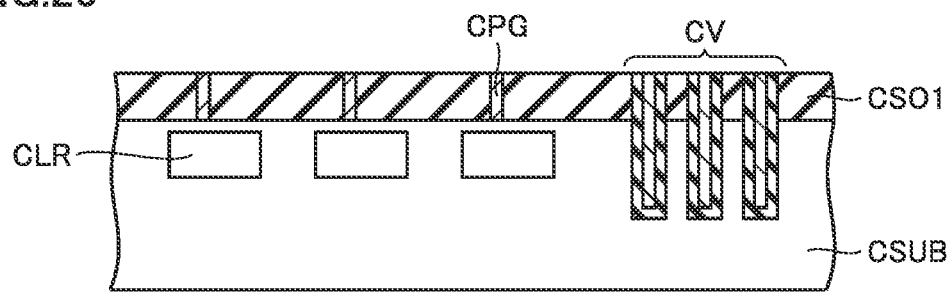
FIG. 25 is a cross-sectional view showing a step performed after the step shown in FIG. 24.

Then, a portion of tungsten film CWF2 located in contact hole CCH2 is left whereas a portion of tungsten film CWF2 located on the upper surface of silicon oxide film CSO1 is removed through a CMP process (a CMP process CC). Thus, a plug CPG is formed as shown in FIG. 25.

Figure 26:
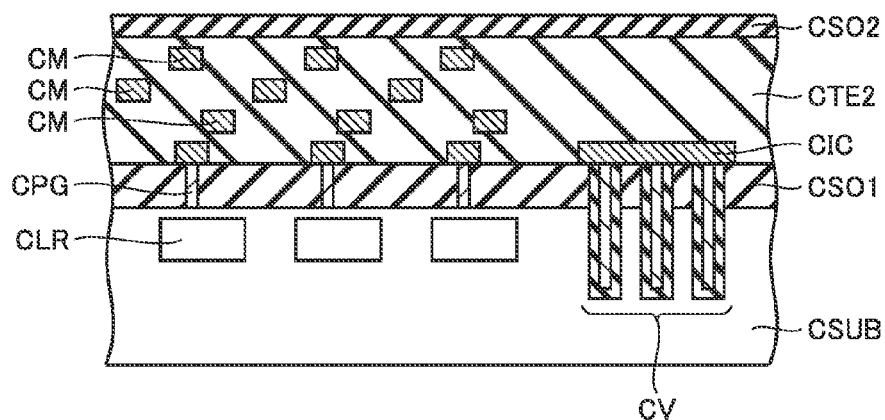
FIG. 26 is a cross-sectional view showing a step performed after the step shown in FIG. 25.
Figure 27:
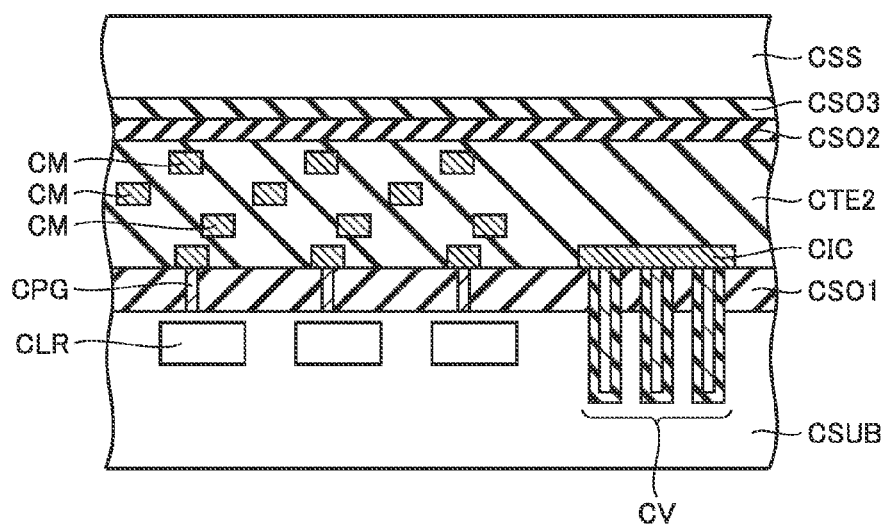
FIG. 27 is a cross-sectional view showing a step performed after the step shown in FIG. 26.

Then, as shown in FIG. 26, a multi-layered interconnection structure including an interconnection CM and an interconnection electrode CIC is formed in a TEOS film CTE2. Then, a silicon oxide film CSO2 is formed as an adhesive layer so as to cover a surface of TEOS film CTE2. Then, as shown in FIG. 27, a support substrate CSS having a silicon oxide film CSO3 formed is prepared as an adhesive layer, and silicon oxide film CSO3 on support substrate CSS is bonded to silicon oxide film CSO2.

Then, as shown in FIG. 28, through via CV is exposed by decreasing a thickness of silicon substrate CSUB through the CMP process. Exposed through via CV is made use of as an alignment mark in subsequent photolithography. Then, a silicon oxide film CSO4 is formed in a manner exposing through via CV. Then, a tungsten film is formed, and a contact pad CCP is formed through prescribed photolithography and etching as shown in FIG. 29.

Figure 30:
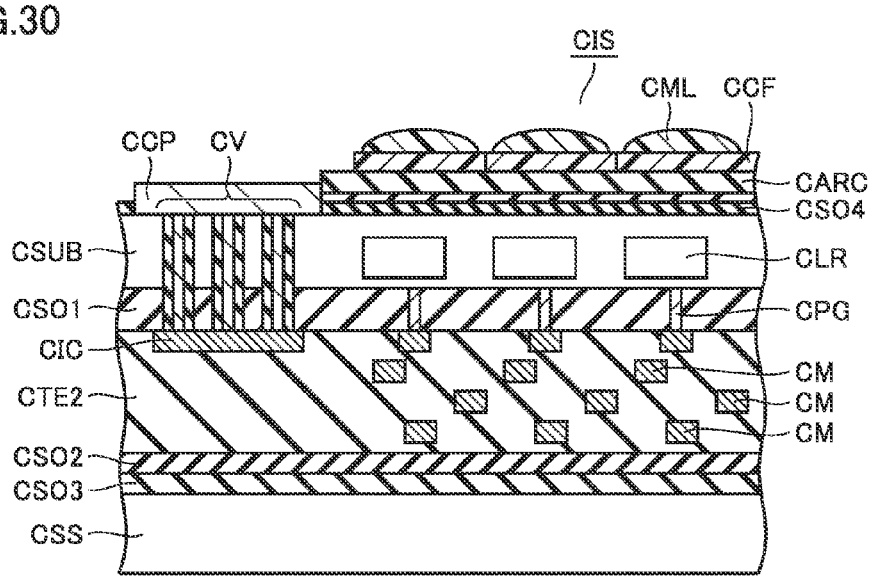
FIG. 30 is a cross-sectional view showing a step performed after the step shown in FIG. 29.

Thereafter, as shown in FIG. 30, a main portion of an imaging device CIS is completed by successively forming an antireflection coating CARC, a color filter CCF, and a microlens CML.

In imaging device CIS according to the comparative example described above, contact pad CCP is electrically connected to interconnection electrode CIC through through via CV. Through via CV is formed from tungsten film CWF1 embedded in contact hole CCH1 having an opening diameter of approximately 1.0 μm. Therefore, in a region where contact pad CCP is arranged, columnar conductive films (tungsten films CWF1) are located at a distance from one another.

Therefore, when an electrical test is conducted with a probe being brought in contact with contact pad CCP or a wire is bonded to contact pad CCP, mechanical strength of the region where contact pad CCP is arranged is not sufficient, and for example, a crack may be generated in silicon oxide film CSO1. When a crack is generated, a crack may also develop between one columnar conductive film and another columnar conductive film arranged at a distance from each other.

In contrast to imaging device CIS according to the comparative example, in imaging device IS according to the first embodiment, groove-type through hole TH3 is formed in the region where electrode pad PAD is arranged and the conductive film is buried in groove-type through hole TH3. Thus, a plurality of wall-like wall-type conductive pass-through portions TB1 corresponding to the shape of the groove are formed.

Thus, as compared with imaging device CIS according to the comparative example in which a plurality of columnar conductive films are formed at a distance from one another, mechanical strength of the region where electrode pad PAD is arranged can be improved. Consequently, when an electrical test is conducted with a probe being brought in contact with electrode pad PAD or a wire is bonded to electrode pad PAD, generation of a crack in first interlayer insulating film IL1 or second interlayer insulating film IL2 can be suppressed. In addition, even though a crack is generated, development of a crack can reliably be prevented by the plurality of wall-type conductive pass-through portions TB1.

The method of manufacturing imaging device IS according to the first embodiment can achieve a reduced number of times of the CMP process in forming wall-type conductive pass-through portion TB1 (through via CV) as compared with the method of manufacturing imaging device CIS according to the comparative example. In this connection, in order to facilitate comparison therebetween, the step of performing the CMP process and main steps around the same will be described with reference to a flowchart.

Figure 31:
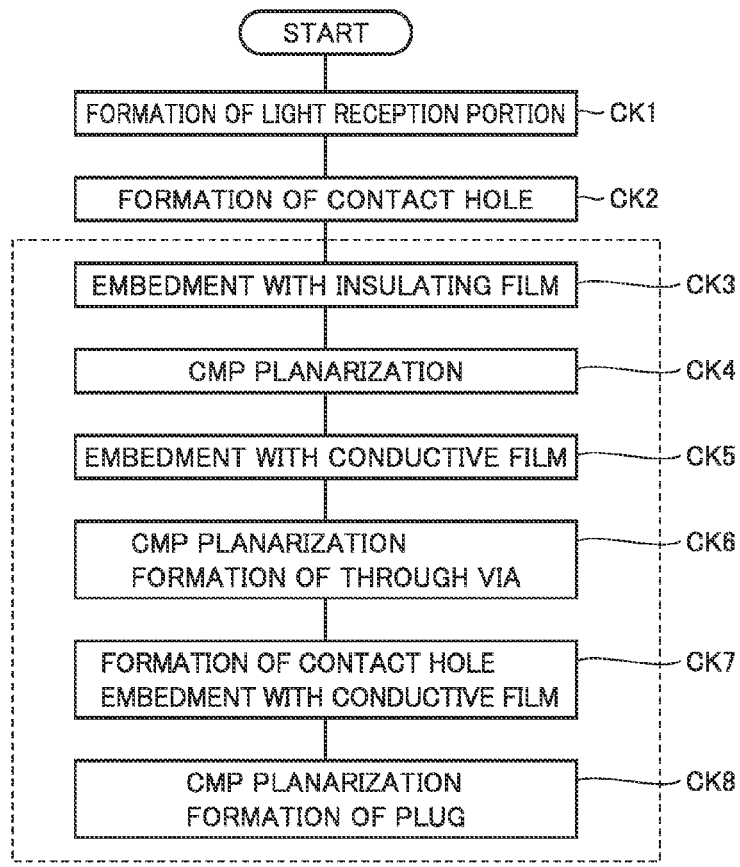
FIG. 31 is a flowchart of a part of a process for manufacturing an imaging device according to the comparative example.

In the method of manufacturing the imaging device according to the comparative example, as shown in FIG. 31, initially, light reception portion CLR is formed in silicon substrate CSUB (step CK1, FIG. 19). Then, contact hole CCH1 is formed in silicon substrate CSUB (step CK2, FIG. 20). Then, an insulating film (TEOS film CTE1) is formed in contact hole CCH1 (step CK3, FIG. 21). Then, the insulating film is subjected to the CMP process (CMP process CA) (step CK4, FIG. 22).

Then, a conductive film (tungsten film CWF1) is embedded in the contact hole (step CK5, FIG. 22). Then, the conductive film is subjected to the CMP process (CMP process CB) to thereby form through via CV (step CK6, FIG. 23). Then, contact hole CCH2 is formed and the conductive film (tungsten film CWF2) is embedded therein (step CK7, FIG. 24). Then, the conductive film is subjected to the CMP process (CMP process CC) to thereby form plug CPG (step CK8, FIG. 25).

Therefore, in imaging device CIS according to the comparative example, the CMP process (CA, CB, CC) is performed three times in order to form through via CV and plug CPG.

Figure 32:
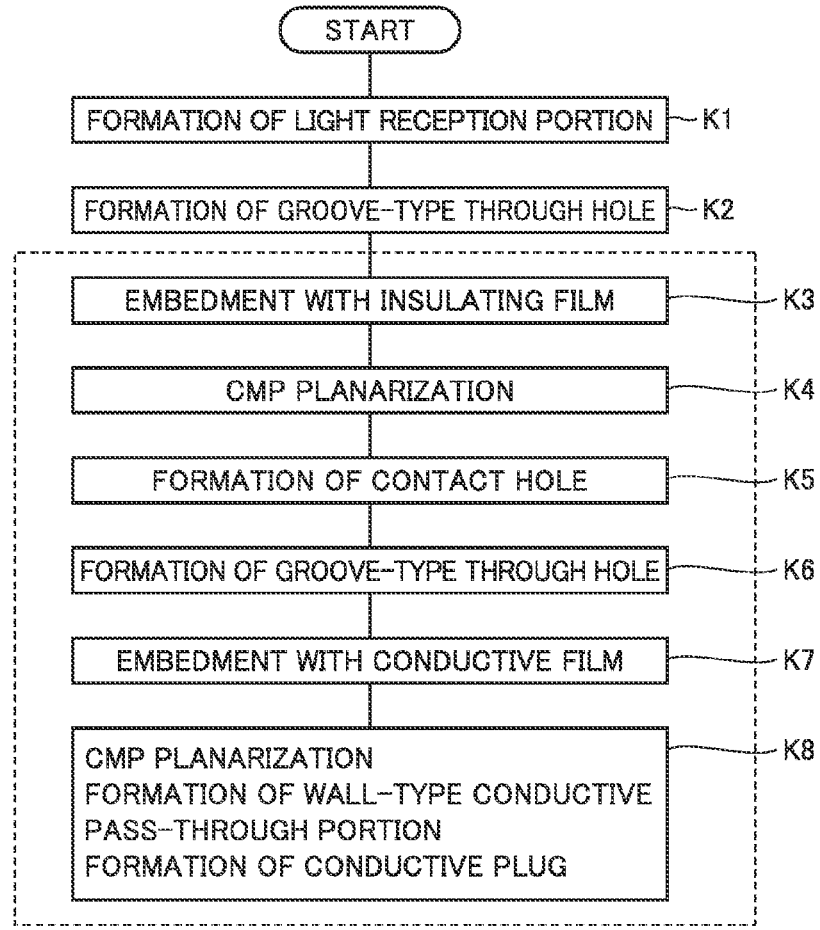
FIG. 32 is a flowchart of a part of a process for manufacturing an imaging device in the first embodiment.

In contrast, in the method of manufacturing the imaging device according to the first embodiment, as shown in FIG. 32, initially, the light reception portion (photodiode PD) is formed in silicon layer SOI (step K1, FIG. 4). Then, groove-type through hole TH2 is formed in silicon layer SOI (step K2, FIG. 6). Then, the insulating film (second interlayer insulating film IL2) is embedded in groove-type through hole TH2 (step K3, FIG. 7). Then, the insulating film is subjected to the CMP process (CMP process A) to thereby planarize the insulating film (step K4, FIG. 7).

Then, contact hole CH is formed in second interlayer insulating film IL2 (step K5, FIG. 7). Then, groove-type through hole TH3 is formed (step K6, FIG. 8). Then, the conductive film (tungsten film) is embedded in groove-type through hole TH3 and contact hole CH (step K7, FIG. 9). Then, the conductive film is subjected to the CMP process (CMP process B) to thereby form wall-type conductive pass-through portion TB1 and conductive plug PG (step K8, FIG. 9).

Therefore, in imaging device IS according to the first embodiment, in order to form wall-type conductive pass-through portion TB1 and conductive plug PG, the CMP process is performed twice. As compared with imaging device CIS according to the comparative example, the number of times of the CMP process can be reduced by one. As the number of times of the CMP process is reduced, excessive polishing such as dishing or erosion can be suppressed and hence degradation of a processed shape or defective electrical connection can be suppressed.

In the method of manufacturing the imaging device according to the comparative example, in forming color filter CCF or microlens CML, through via CV is made use of as an alignment mark. Through via CV, however, has been formed through the CMP process. Therefore, the surface of exposed through via CV and the surface of silicon substrate CSUB are substantially flush with each other. Therefore, there may be a case that it is difficult to recognize through via CV as an alignment mark.

In contrast, in the method of manufacturing the imaging device according to the first embodiment, a part of wall-type conductive pass-through portion TB1 serving as an alignment mark is formed to protrude from silicon layer SOI. Thus, accuracy in recognition of wall-type conductive pass-through portion TB1 as an alignment mark can be improved, which can consequently contribute to improvement in patterning accuracy after formation of wall-type conductive pass-through portion TB1 protruding from silicon layer SOI.

Furthermore, in the method of manufacturing the imaging device according to the comparative example, through via CV is formed in one step (see FIG. 23) and plug CPG is formed in another step (see FIG. 25). In contrast, in the method of manufacturing the imaging device according to the first embodiment, wall-type conductive pass-through portion TB1 and conductive plug PG are formed in the same step (see FIG. 9). Thus, the number of steps can be reduced.

In the imaging device according to the comparative example, through via CV electrically connecting contact pad CCP and interconnection electrode CIC to each other is formed as a columnar conductive film (tungsten film CWF1). In contrast, in the imaging device according to the first embodiment, wall-type conductive pass-through portion TB1 electrically connecting electrode pad PAD and first interconnection M1 to each other is formed like a wall corresponding to a shape of the groove of groove-type through hole TH3. Thus, connection resistance can be suppressed.

(First Modification)

Figure 33:
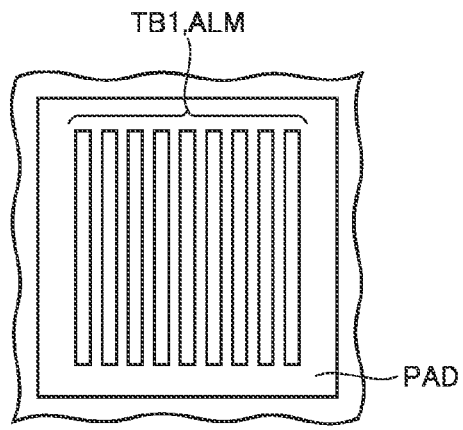
FIG. 33 is a partial enlarged plan view showing a region where an electrode pad of an imaging device according to a first modification of the first embodiment is arranged.

In connection with imaging device IS described above, a case that five wall-type conductive pass-through portions TB1 are formed as wall-type conductive pass-through portion TB1 formed in the region where electrode pad PAD is arranged has been described by way of example. The number of wall-type conductive pass-through portions TB1 is not limited to five, but more wall-type conductive pass-through portions TB1 may be formed as shown in FIG. 33.

Thus, the imaging device according to the first modification can achieve further improved mechanical strength of the region where electrode pad PAD is arranged. Connection resistance between electrode pad PAD and first interconnection M1 (see FIG. 2) can further be lowered.

(Second Modification)

As shown in FIG. 1, in imaging device IS, in order to ensure resistance to moisture, seal ring SLR is formed to surround a region where chip formation region TFR and electrode pad PAD are arranged. A structure of seal ring SLR may be such a structure as being formed simultaneously with the step of forming wall-type conductive pass-through portion TB1 in the region where electrode pad PAD is arranged as shown in FIG. 34.

Figure 34:
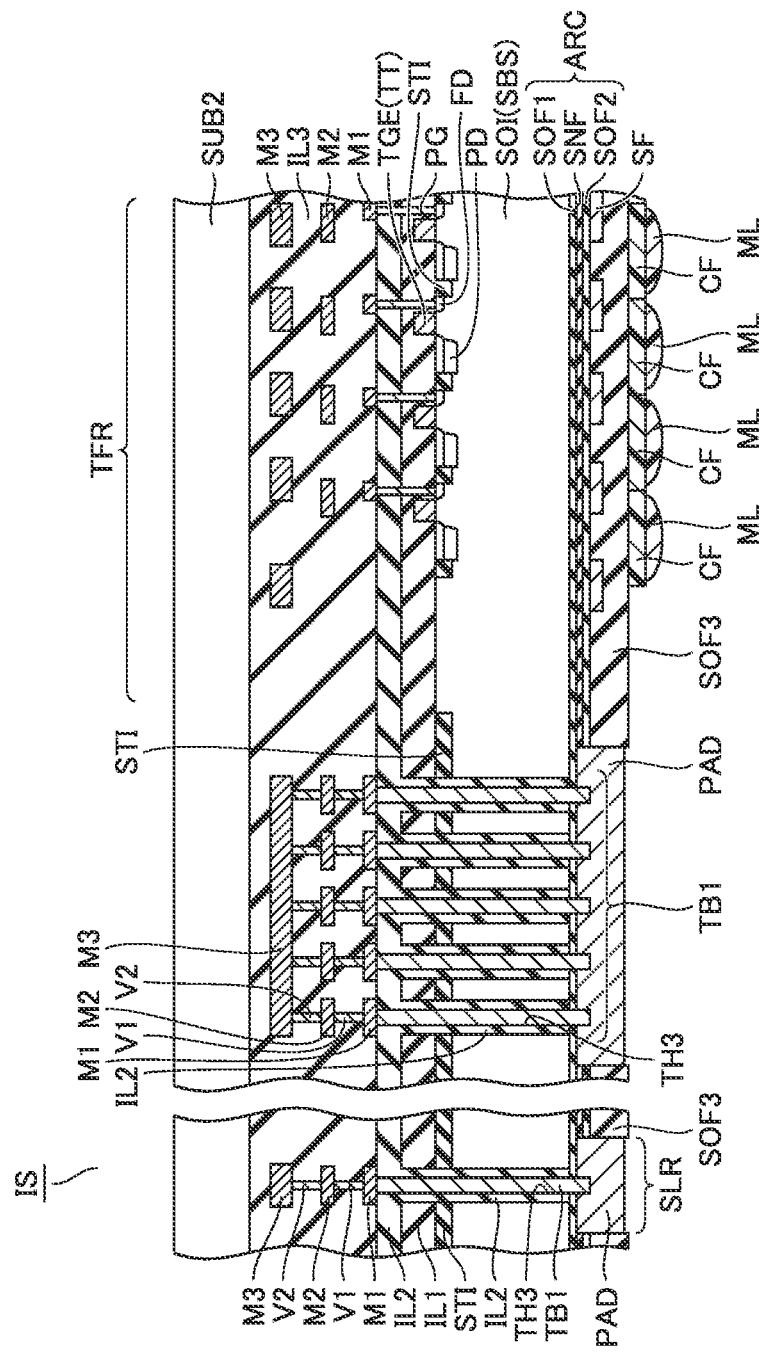
FIG. 34 is a cross-sectional view showing an imaging device according to a second modification of the first embodiment, along a line corresponding to the line XXXIV-XXXIV shown in FIG. 1.

Though FIG. 34 has, as reference numerals of portions constituting seal ring SLR, reference numerals the same as those for the portions constituting the region where electrode pad PAD is arranged, those portions do not have corresponding functions.

Second Embodiment

An imaging device in which an electrode pad and an interconnection are electrically connected to each other through a frame-type conductive pass-through portion in which wall-type conductive pass-through portions are combined to form a frame will be described.

Figure 35:
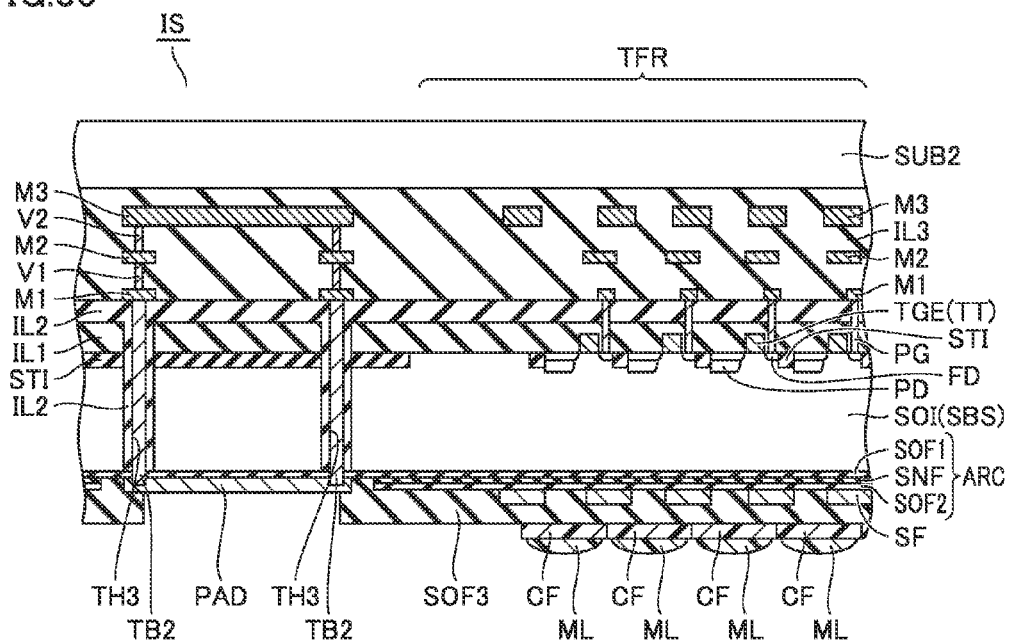
FIG. 35 is a cross-sectional view of an imaging device according to a second embodiment.
Figure 36:
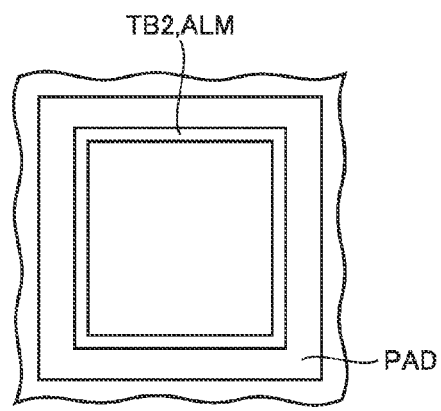
FIG. 36 is a partial enlarged plan view showing a region where an electrode pad is arranged in the second embodiment.

As shown in FIGS. 35 and 36, in a region of imaging device IS where electrode pad PAD is arranged, a frame-type through hole in which groove-type through holes TH3 are combined into a frame shape is formed, and a frame-type conductive pass-through portion TB2 corresponding to the shape of the frame is formed by embedding the frame-type through hole with a conductive film. Since features are otherwise the same as those in imaging device IS shown in FIGS. 2 and 3 described in the first embodiment, the same members have the same reference numerals allotted and description thereof will not be repeated unless it is necessary.

Figure 37:
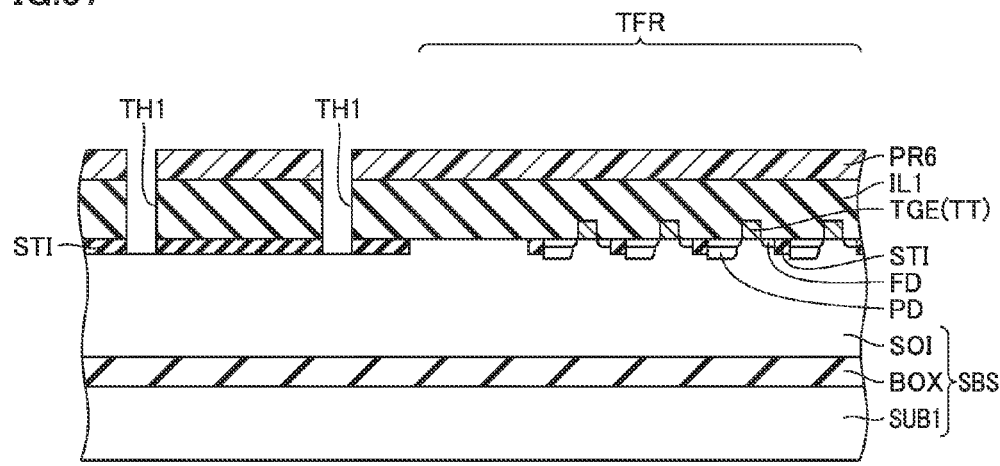
FIG. 37 is a cross-sectional view showing one step in a method of manufacturing an imaging device in the second embodiment.

A method of manufacturing the imaging device described above will now be described. Initially, first interlayer insulating film IL1 shown in FIG. 5 is formed through the step the same as the step shown in FIG. 4 described previously, and thereafter a photoresist pattern PR6 is formed through prescribed photolithography as shown in FIG. 37. Then, by etching first interlayer insulating film IL1 with photoresist pattern PR6 serving as an etching mask, groove-type through hole TH1 arranged in a frame which passes through first interlayer insulating film IL1 and exposes silicon layer SOI is formed. Thereafter, photoresist pattern PR6 is removed.

Figure 38:
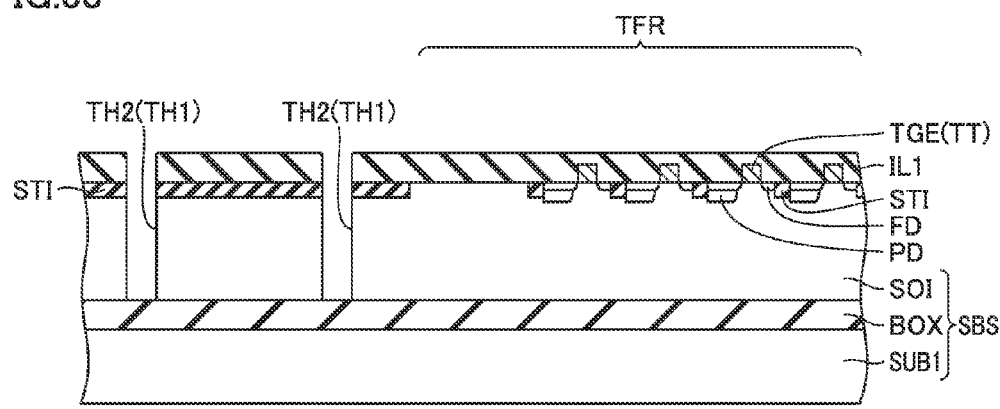
FIG. 38 is a cross-sectional view showing a step performed after the step shown in FIG. 37 in the second embodiment.
Figure 39:
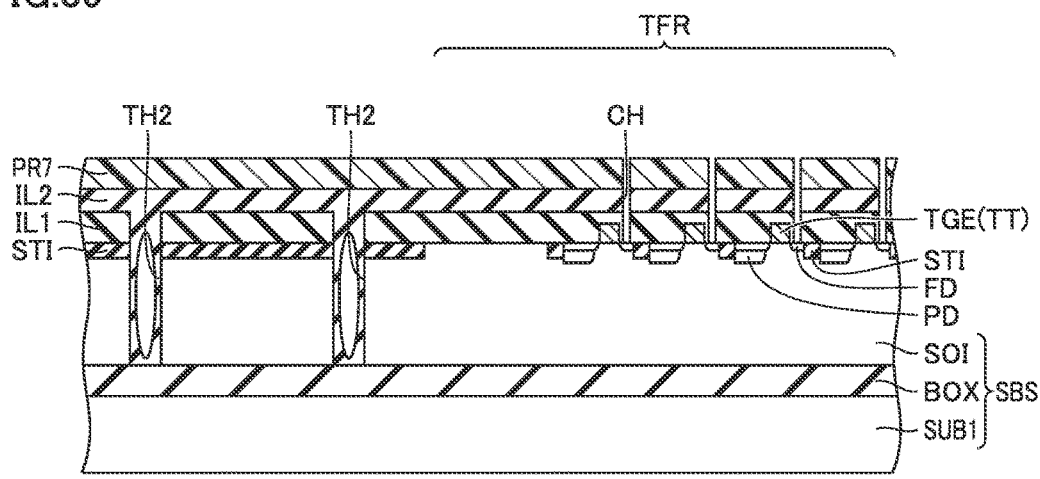
FIG. 39 is a cross-sectional view showing a step performed after the step shown in FIG. 38 in the second embodiment.

Then, as shown in FIG. 38, by etching silicon layer SOI with exposed first interlayer insulating film IL1 serving as an etching mask, groove-type through hole TH2 arranged in a frame which passes through silicon layer SOI and exposes embedded oxide film BOX is formed. Then, as shown in FIG. 39, contact hole CH exposing floating diffusion region FD is formed through the step the same as the step shown in FIG. 7. Thereafter, a photoresist pattern PR7 is removed.

Figure 40:
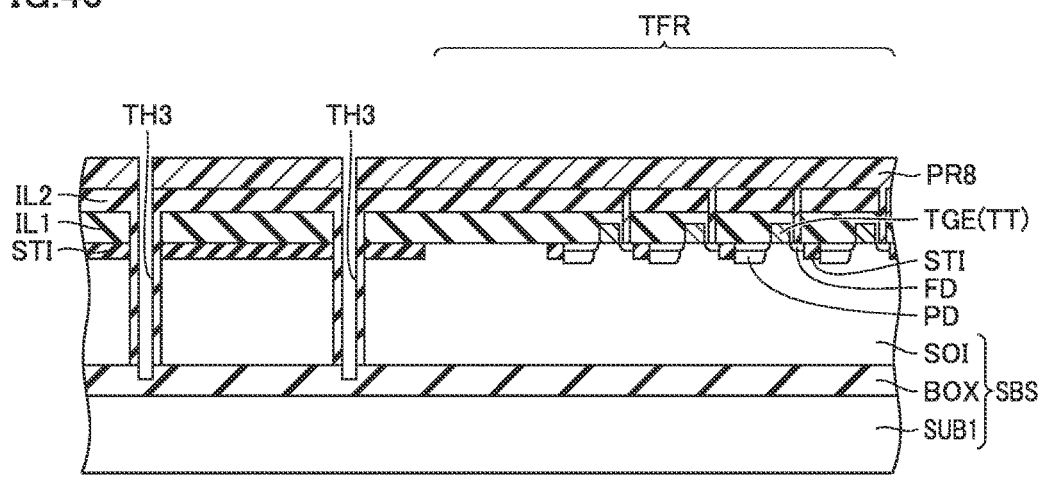
FIG. 40 is a cross-sectional view showing a step performed after the step shown in FIG. 39 in the second embodiment.

Then, as shown in FIG. 40, a photoresist pattern PR8 is formed through prescribed photolithography. Then, by etching second interlayer insulating film IL2 with photoresist pattern PR8 serving as an etching mask, groove-type through hole TH3 arranged in a frame is formed.

Here, embedded oxide film BOX is removed by approximately several ten nm as in the step shown in FIG. 8. In addition, a size and an etching condition of groove-type through hole TH3 are set in advance such that first interlayer insulating film IL1 (and second interlayer insulating film IL2) is left by approximately several ten nm between groove-type through hole TH3 and silicon layer SOI. Thereafter, photoresist pattern PR8 is removed.

Figure 41:
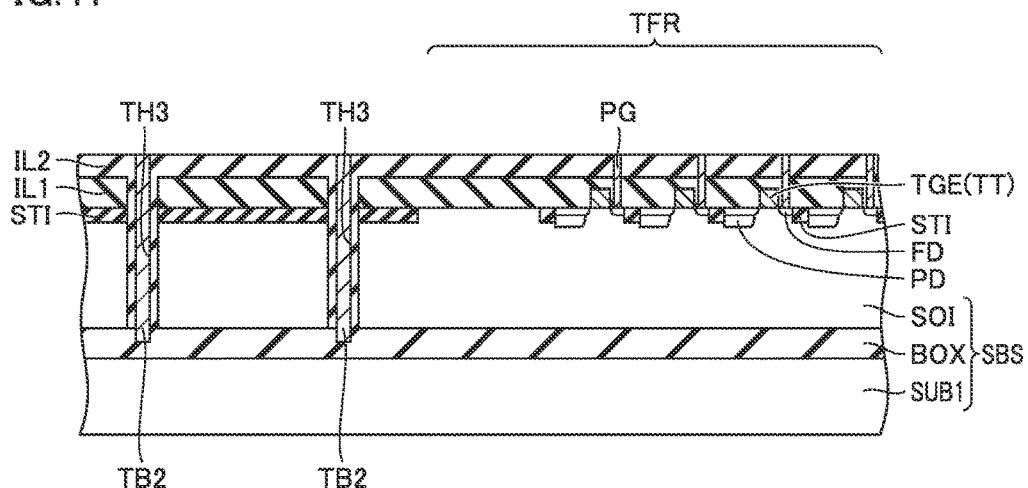
FIG. 41 is a cross-sectional view showing a step performed after the step shown in FIG. 40 in the second embodiment.
Figure 42:
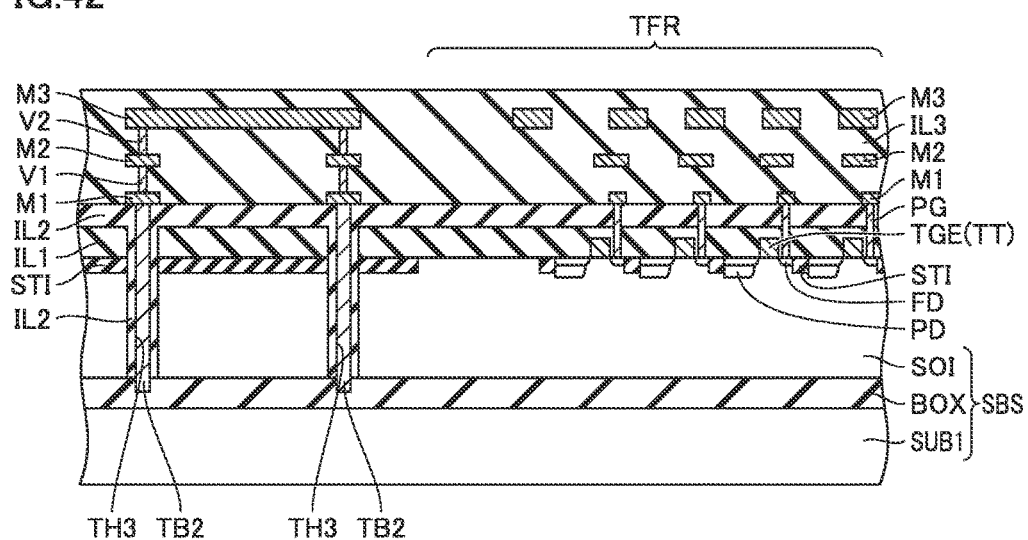
FIG. 42 is a cross-sectional view showing a step performed after the step shown in FIG. 41 in the second embodiment.

Then, through the step the same as the step shown in FIG. 9, as shown in FIG. 41, frame-type conductive pass-through portion TB2 corresponding to the shape of the frame is formed in groove-type through hole TH3 arranged in a frame. Conductive plug PG is formed in contact hole CH. Then, through the step the same as the step shown in FIG. 10, as shown in FIG. 42, a multi-layered interconnection structure including first interconnection M1, first via V1, second interconnection M2, second via V2, and third interconnection M3 is formed.

Figure 43:
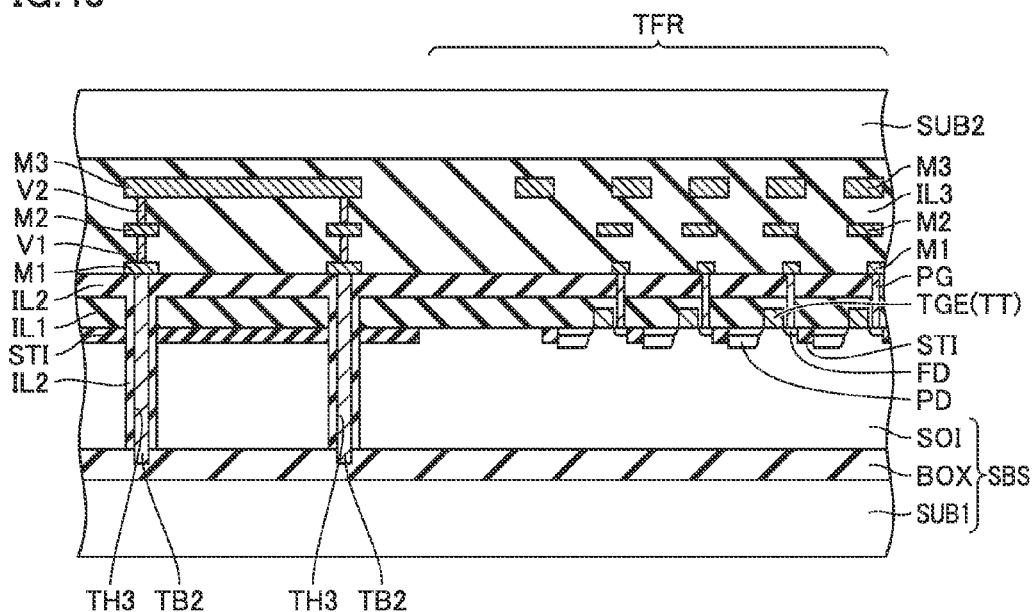
FIG. 43 is a cross-sectional view showing a step performed after the step shown in FIG. 42 in the second embodiment.
Figure 44:
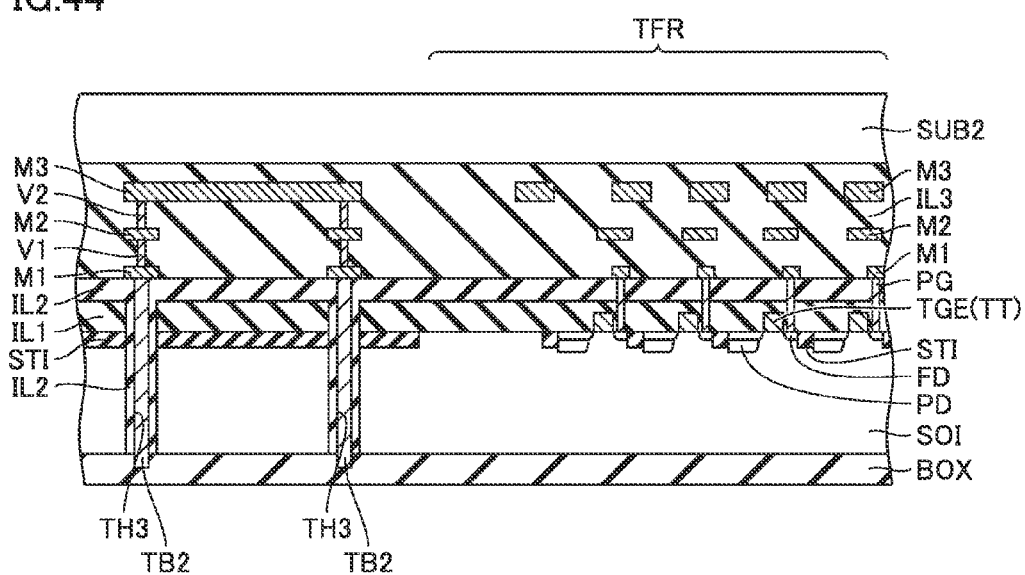
FIG. 44 is a cross-sectional view showing a step performed after the step shown in FIG. 43 in the second embodiment.
Figure 45:
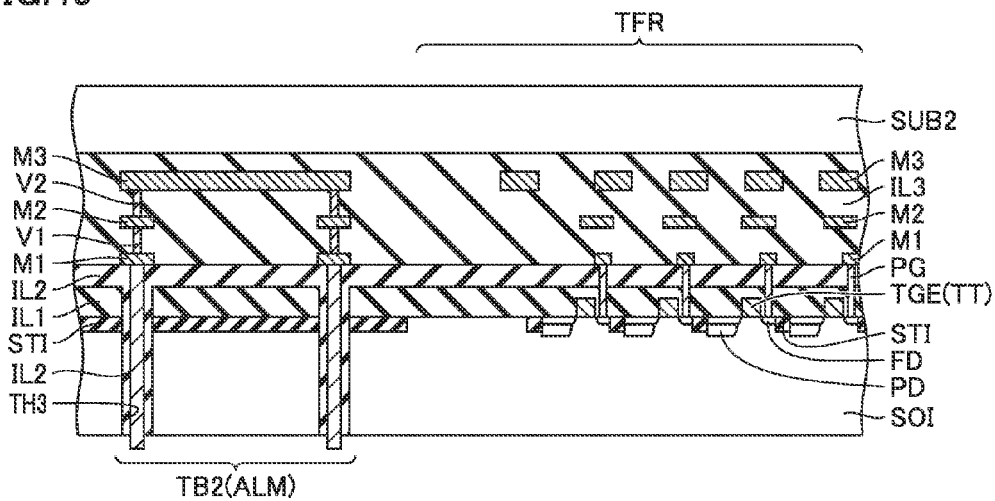
FIG. 45 is a cross-sectional view showing a step performed after the step shown in FIG. 44 in the second embodiment.

Then, as shown in FIG. 43, support substrate SUB2 is bonded to the surface of interlayer insulating film IL3. Then, as shown in FIG. 44, support substrate SUB1 is removed through the CMP process, the dry etching process, or the wet etching process. Then, as shown in FIG. 45, embedded oxide film BOX is removed through the dry etching process. Thus, a portion of frame-type conductive pass-through portion TB2 protruding from silicon layer SOI is exposed.

Figure 46:
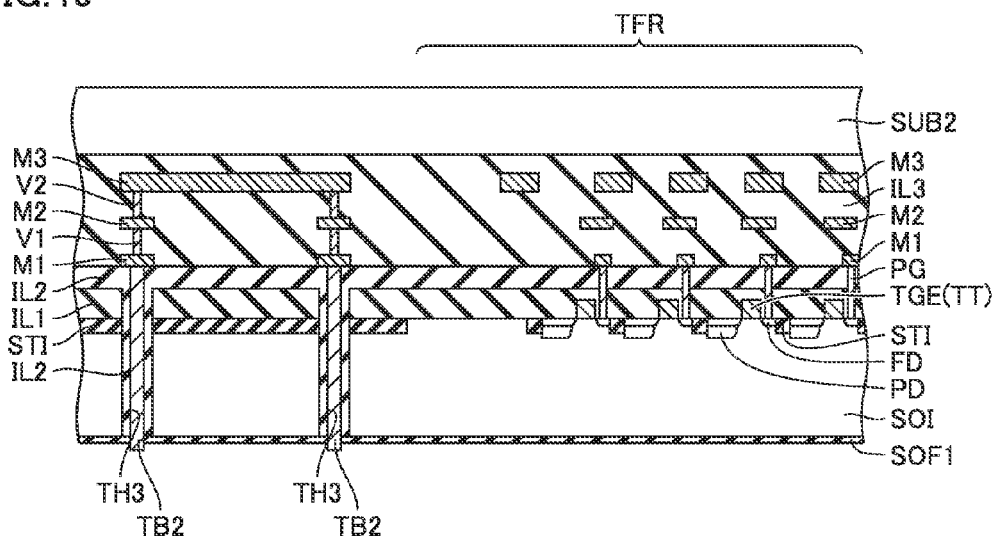
FIG. 46 is a cross-sectional view showing a step performed after the step shown in FIG. 45 in the second embodiment.
Figure 47:
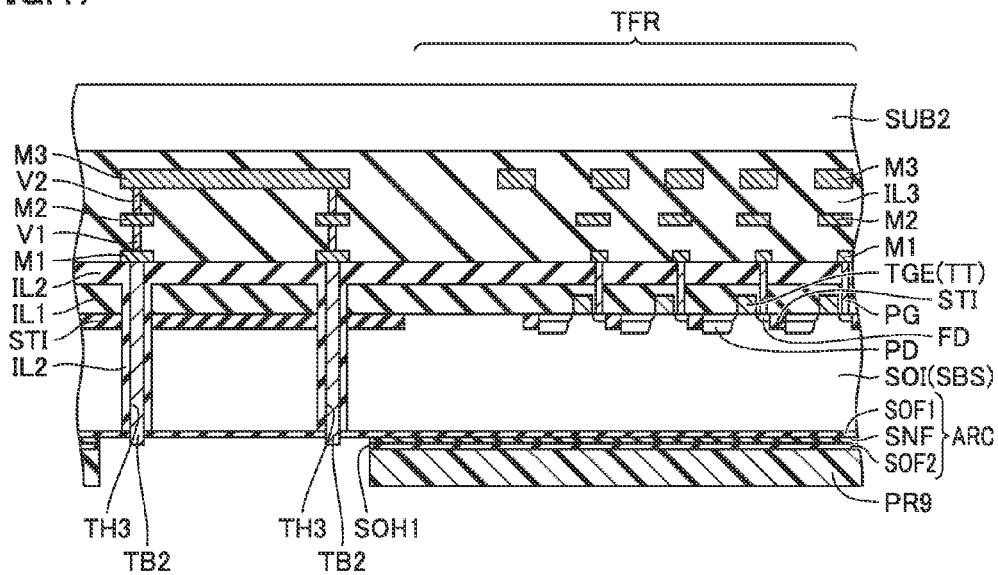
FIG. 47 is a cross-sectional view showing a step performed after the step shown in FIG. 46 in the second embodiment.

Then, as shown in FIG. 46, silicon oxide film SOFT is formed to cover the surface of silicon layer SOI. Then, silicon nitride film SNF and silicon oxide film SOF2 (see FIG. 47) are successively formed to cover silicon oxide film SOF1. Then, as shown in FIG. 47, a photoresist pattern PR9 is formed through prescribed photolithography with protruding frame-type conductive pass-through portion TB2 serving as an alignment mark.

Then, by etching silicon oxide film SOF2 and silicon nitride film SNF with photoresist pattern PR9 serving as an etching mask, an opening portion SOH1 exposing frame-type conductive pass-through portion TB2 is formed. Thereafter, photoresist pattern PR9 is removed.

Figure 48:
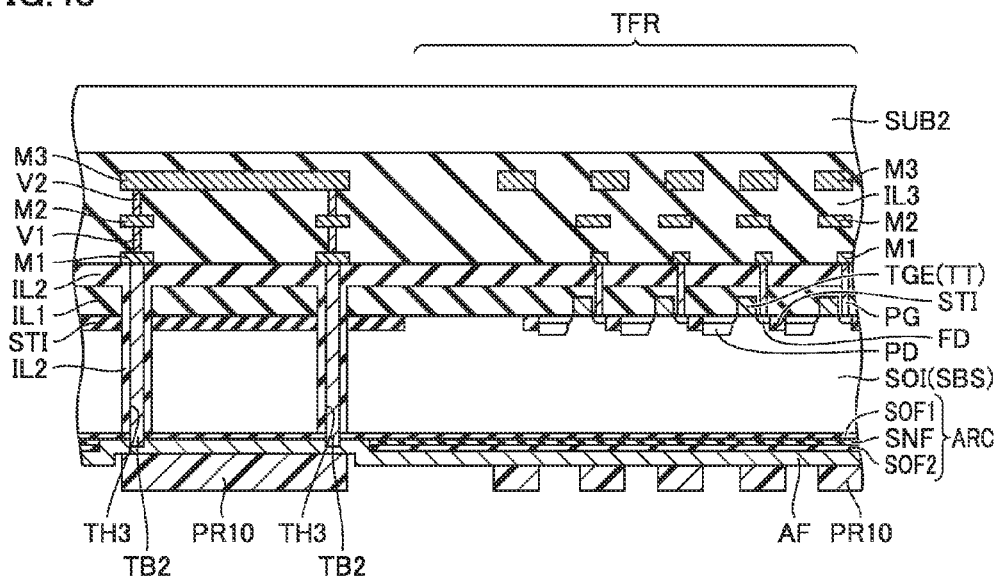
FIG. 48 is a cross-sectional view showing a step performed after the step shown in FIG. 47 in the second embodiment.

Then, as shown in FIG. 48, aluminum film AF to be a light shield film is formed to cover exposed frame-type conductive pass-through portion TB2 and silicon oxide film SOF2. Then, a photoresist pattern PR10 is formed through prescribed photolithography with protruding frame-type conductive pass-through portion TB2 serving as an alignment mark. Then, by etching aluminum film AF with photoresist pattern PR10 serving as an etching mask, electrode pad PAD and light shield film SF are simultaneously formed. Electrode pad PAD is electrically connected to first interconnection M1 through frame-type conductive pass-through portion TB2. Thereafter, photoresist pattern PR10 is removed.

Figure 49:
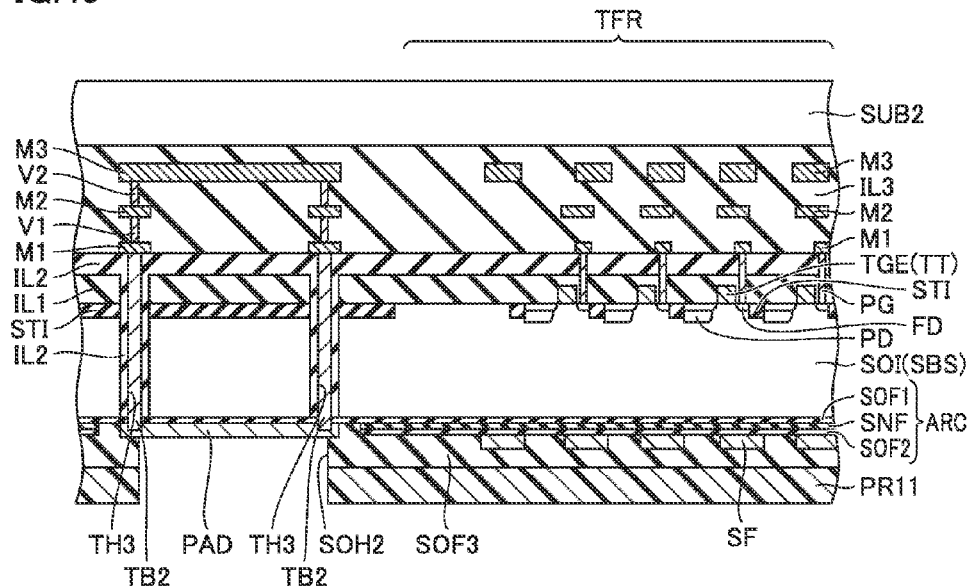
FIG. 49 is a cross-sectional view showing a step performed after the step shown in FIG. 48 in the second embodiment.

Then, silicon oxide film SOF3 (see FIG. 49) is formed to cover electrode pad PAD and light shield film SF. Then, as shown in FIG. 49, a photoresist pattern PR11 is formed through prescribed photolithography with protruding frame-type conductive pass-through portion TB2 serving as an alignment mark. Then, by etching silicon oxide film SOF3 with photoresist pattern PR11 serving as an etching mask, an opening portion SOH2 exposing electrode pad PAD is formed. Thereafter, photoresist pattern PR11 is removed.

Then, color filter CF (see FIG. 50) is formed by etching a resin film with a photoresist pattern (not shown) serving as an etching mask, the photoresist pattern having been formed through prescribed photolithography with frame-type conductive pass-through portion TB2 serving as an alignment mark, as in the step shown in FIG. 18.

Figure 50:
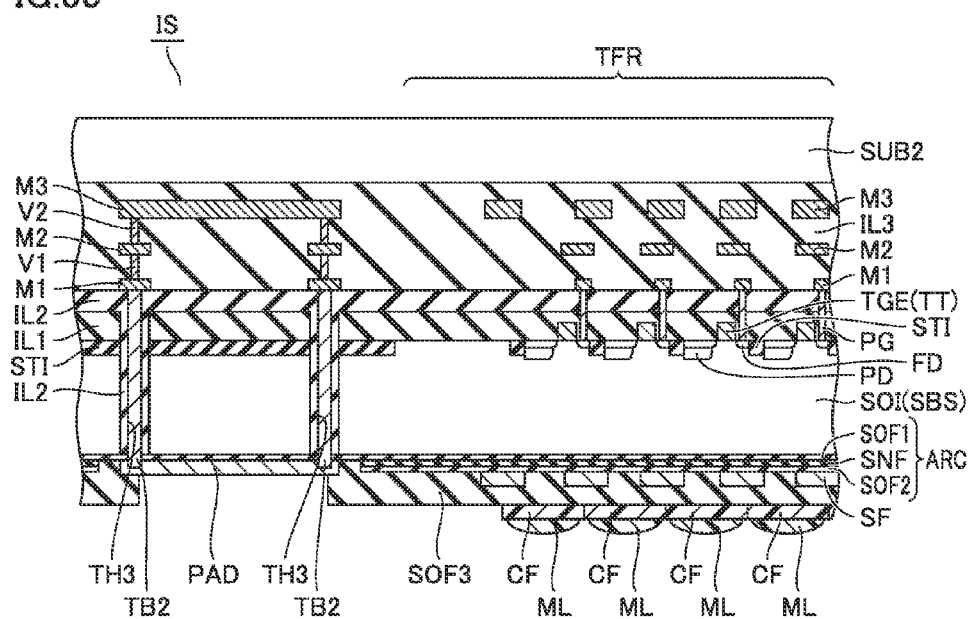
FIG. 50 is a cross-sectional view showing a step performed after the step shown in FIG. 49 in the second embodiment.

Then, microlens ML (see FIG. 50) is formed by etching a resin film with a photoresist pattern (not shown) serving as an etching mask, the photoresist pattern having been formed through prescribed photolithography with frame-type conductive pass-through portion TB2 serving as an alignment mark. Thereafter, the photoresist pattern is removed. Thus, as shown in FIG. 50, a main portion of the imaging device including a back side illuminated CMOS sensor is completed.

In imaging device IS described above, initially, in a region where electrode pad PAD is arranged, groove-type through hole TH3 arranged in a frame is formed and frame-type conductive pass-through portion TB2 corresponding to the shape of the frame is formed by embedding groove-type through hole TH3 with a conductive film.

Thus, as compared with imaging device CIS (see FIG. 30) according to the comparative example in which a columnar conductive film is formed, mechanical strength of the region where electrode pad PAD is arranged can be improved. Consequently, when an electrical test is conducted with a probe being brought in contact with electrode pad PAD or a wire is bonded to electrode pad PAD, generation of a crack in first interlayer insulating film IL1 or second interlayer insulating film IL2 can be suppressed. Even when a crack is generated, development of the crack can reliably be prevented owing to frame-type conductive pass-through portion TB2.

Additionally, imaging device IS described above achieves effects as follows.

Initially, electrode pad PAD is formed by patterning an aluminum film which is formed to bury opening portion SOH1 (see FIG. 47) formed in antireflection coating ARC. In imaging device IS according to the first embodiment, electrode pad PAD is formed by patterning an aluminum film which is formed to bury opening portion SOH (see FIG. 16) formed in antireflection coating ARC and silicon oxide film SOF3.

In this case, when a difference in height of the opening portion is compared, opening portion SOH1 is smaller in height difference by a thickness of silicon oxide film SOF3 than opening portion SOH. Thus, in terms of planarity of the aluminum film in a central portion of the opening portion corresponding to a portion around the center of the electrode pad, planarity around the center of opening portion SOH1 is better than planarity around the center of opening portion SOH. Consequently, wire bonding can be carried out in a more stable manner.

Furthermore, in imaging device IS described above, electrode pad PAD is formed simultaneously with light shield film SF (see FIG. 48). Thus, as compared with a case that the step of forming electrode pad PAD and the step of forming light shield film SF are separate from each other, the number of steps can be reduced.

Other than the above, in imaging device IS described above, as in the imaging device according to the first embodiment, as compared with the imaging device according to the comparative example, the number of times of the CMP process performed for forming frame-type conductive pass-through portion TB2 and conductive plug PG can be reduced. Thus, excessive polishing such as dishing or erosion can be suppressed and hence degradation of a processed shape or defective electrical connection can be suppressed.

In addition, a part of frame-type conductive pass-through portion TB2 serving as an alignment mark is formed to protrude from silicon layer SOI, so that accuracy in recognition of frame-type conductive pass-through portion TB2 as the alignment mark can be improved, which can contribute to improvement in patterning accuracy after formation of frame-type conductive pass-through portion TB2 protruding from silicon layer SOI. Furthermore, frame-type conductive pass-through portion TB2 and conductive plug PG are formed in the same step (see FIG. 41), so that the number of steps can be reduced.

Modification of Each Embodiment

In the first embodiment, such a structure that wall-type conductive pass-through portion TB1 is formed in the region where electrode pad PAD is arranged has been described. In the second embodiment, such a structure that frame-type conductive pass-through portion TB2 in which the wall-type conductive pass-through portions are arranged in a frame is formed in the region where electrode pad PAD is arranged has been described.

Furthermore, the feature that each of wall-type conductive pass-through portion TB1 and frame-type conductive pass-through portion TB2 has a function as an alignment mark has been described. From a point of view of improvement in alignment accuracy as the alignment mark, a modification of the wall-type conductive pass-through portion or the frame-type conductive pass-through portion will be mentioned below.

Figure 51:
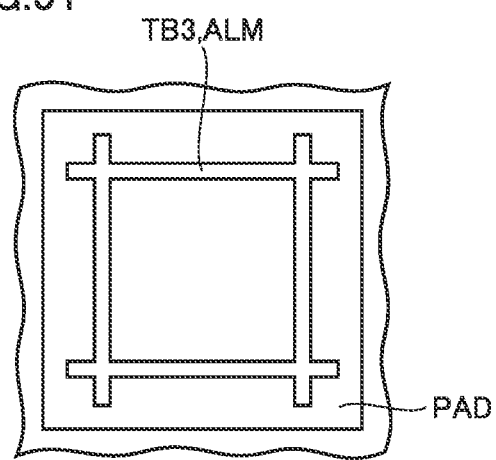
FIG. 51 is a partial enlarged plan view showing a region where an electrode pad of an imaging device according to a first modification of each embodiment is arranged.
Figure 52:
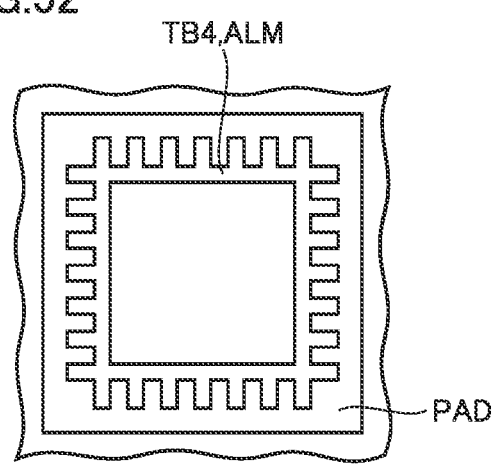
FIG. 52 is a partial enlarged plan view showing a region where an electrode pad of an imaging device according to a second modification of each embodiment is arranged.
Figure 53:
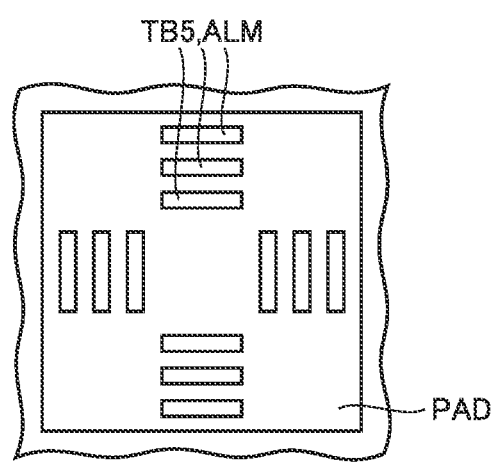
FIG. 53 is a partial enlarged plan view showing a region where an electrode pad of an imaging device according to a third modification of each embodiment is arranged.

Initially, as a modification of frame-type conductive pass-through portion TB2 in which the wall-type conductive pass-through portions are arranged in a frame shown in FIG. 36, a frame-type conductive pass-through portion TB3 may be provided as shown in FIG. 51 in which wall-type conductive pass-through portions intersect with each other at a corner. Alternatively, as shown in FIG. 52, a frame-type conductive pass-through portion TB4 in which a plurality of protruding portions extending from the wall-type conductive pass-through portion are arranged at a distance from one another may be provided. Furthermore, as a modification of wall-type conductive pass-through portion TB1 shown in FIG. 3, as shown in FIG. 53, a wall-type conductive pass-through portion TB5, with a plurality of wall-type conductive pass-through portions being arranged along each of four sides of electrode pad PAD, may be provided.

By forming such a conductive pass-through portion including frame-type conductive pass-through portion TB3 or TB4 or wall-type conductive pass-through portion TB5, alignment accuracy as an alignment mark can be improved. In addition, an effect to improve mechanical strength of a region where an electrode pad is arranged can be achieved.

The imaging devices described in the embodiments can variously be combined as necessary. A numeric value for a thickness is by way of example, without being limited.

Though the invention made by the present inventor has specifically been described above based on the embodiments, the present invention is not limited to the embodiments, but can naturally be modified variously within the scope not departing from the gist thereof.

Though the embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. An imaging device, comprising:
   a light reception sensor portion formed on a side of a first main surface of a semiconductor layer having the first main surface and a second main surface opposite the first main surface;
   a support substrate formed on the side of said first main surface of said semiconductor layer with a plurality of interlayer insulating layers being interposed;
   a plurality of interconnection layers formed between said interlayer insulating layers;
   a light incident region formed on a side of said second main surface of said semiconductor layer;
   an electrode pad formed on the side of said second main surface of said semiconductor layer;
   a substantially planar conductive pass-through portion which is formed to pass through said semiconductor layer so as to contact said electrode pad and electrically connect said electrode pad and one of said plurality of interconnection layers to each other; and
   a seal ring formed to surround a region where said light reception sensor portion and said electrode pad are arranged,
   wherein said seal ring is formed in a same layer as said electrode pad.

2. The imaging device according to claim 1, wherein said substantially planar conductive pass-through portion extends along a direction in which a portion of said seal ring extends in a plan view.

3. The imaging device according to claim 1, wherein said conductive pass-through portion is formed to protrude from said second main surface of said semiconductor layer.

4. The imaging device according to claim 1, including a plurality of said substantially planar conductive pass-through portions extending in one direction and arranged at a distance from one another in a second direction intersecting said one direction.

5. The imaging device according to claim 1, including a plurality of said substantially planar conductive pass-through portions arranged in a frame configuration.

6. The imaging device according to claim 1, wherein a light shield film, a color filter, and a microlens are formed in said light incident region.

* * * * *